United States Patent
Hirowatari et al.

(10) Patent No.: US 11,710,863 B2
(45) Date of Patent: Jul. 25, 2023

(54) RECOVERY CONTROL METHOD FOR SECONDARY BATTERY, RECOVERY CONTROL SYSTEM FOR SECONDARY BATTERY, AND VEHICLE CONTROL SYSTEM

(71) Applicants: Nissan Motor Co., Ltd., Yokohama (JP); Renault S.A.S., Boulogne-Billancourt (FR)

(72) Inventors: Anna Hirowatari, Kanagawa (JP); Toshikazu Kotaka, Kanagawa (JP); Koichiro Aotani, Kanagawa (JP)

(73) Assignees: Nissan Motor Co., Ltd., Yokohama (JP); Renault S.A.S., Boulogne-Billancourt (FR)

( * ) Notice: Subject to any disclaimer, the term of this patent is extended or adjusted under 35 U.S.C. 154(b) by 0 days.

(21) Appl. No.: 17/925,778

(22) PCT Filed: May 20, 2020

(86) PCT No.: PCT/IB2020/000503
§ 371 (c)(1),
(2) Date: Nov. 16, 2022

(87) PCT Pub. No.: WO2021/234424
PCT Pub. Date: Nov. 25, 2021

(65) Prior Publication Data
US 2023/0198033 A1    Jun. 22, 2023

(51) Int. Cl.
*H02J 7/00* (2006.01)
*H01M 10/44* (2006.01)
(Continued)

(52) U.S. Cl.
CPC ........ *H01M 10/448* (2013.01); *G01R 31/388* (2019.01); *G01R 31/389* (2019.01);
(Continued)

(58) Field of Classification Search
CPC ............ H01M 10/448; H01M 10/484; H01M 10/486; H01M 10/615; G01R 31/388; G01R 31/389
(Continued)

(56) References Cited

U.S. PATENT DOCUMENTS

| | | | |
|---|---|---|---|
| 10,727,545 B1 * | 7/2020 | Gan | H01M 4/382 |
| 2010/0250038 A1 * | 9/2010 | Morita | B60L 58/12 |
| | | | 320/136 |
| 2019/0190089 A1 * | 6/2019 | Isomura | H01M 10/4242 |

FOREIGN PATENT DOCUMENTS

| | | | |
|---|---|---|---|
| JP | 2008-097940 A | 4/2008 | |
| JP | 2010-238484 A | 10/2010 | |

(Continued)

*Primary Examiner* — Zixuan Zhou
(74) *Attorney, Agent, or Firm* — Young Basile Hanlon & MacFarlane, P.C.

(57) ABSTRACT

In a recovery control method for a secondary battery that includes a positive electrode containing a positive electrode active material, a solid electrolyte, and a negative electrode containing a negative electrode active material containing at least a lithium metal or a lithium alloy, and is fastened from an outside, the recovery control method includes: measuring cell resistance of the secondary battery; calculating a recovery limit resistance value indicating an upper limit value of resistance that ensures recovering the secondary battery from a depth of charge/discharge of the secondary battery, a cell temperature of the secondary battery, and a pressure applied to the secondary battery; and inhibiting charging/discharging the secondary battery and executing recovery control that recovers the secondary battery when a resistance value of the cell resistance is equal to or less than the recovery limit resistance value.

12 Claims, 11 Drawing Sheets

(51) Int. Cl.
*H01M 10/48* (2006.01)
*G01R 31/388* (2019.01)
*H01M 10/615* (2014.01)
*G01R 31/389* (2019.01)

(52) U.S. Cl.
CPC ....... *H01M 10/484* (2013.01); *H01M 10/486* (2013.01); *H01M 10/615* (2015.04)

(58) Field of Classification Search
USPC .................................. 320/109, 134; 701/22
See application file for complete search history.

(56) References Cited

FOREIGN PATENT DOCUMENTS

| | | |
|---|---|---|
| JP | 2012-212513 A | 11/2012 |
| JP | 2016-009679 A | 1/2016 |

\* cited by examiner

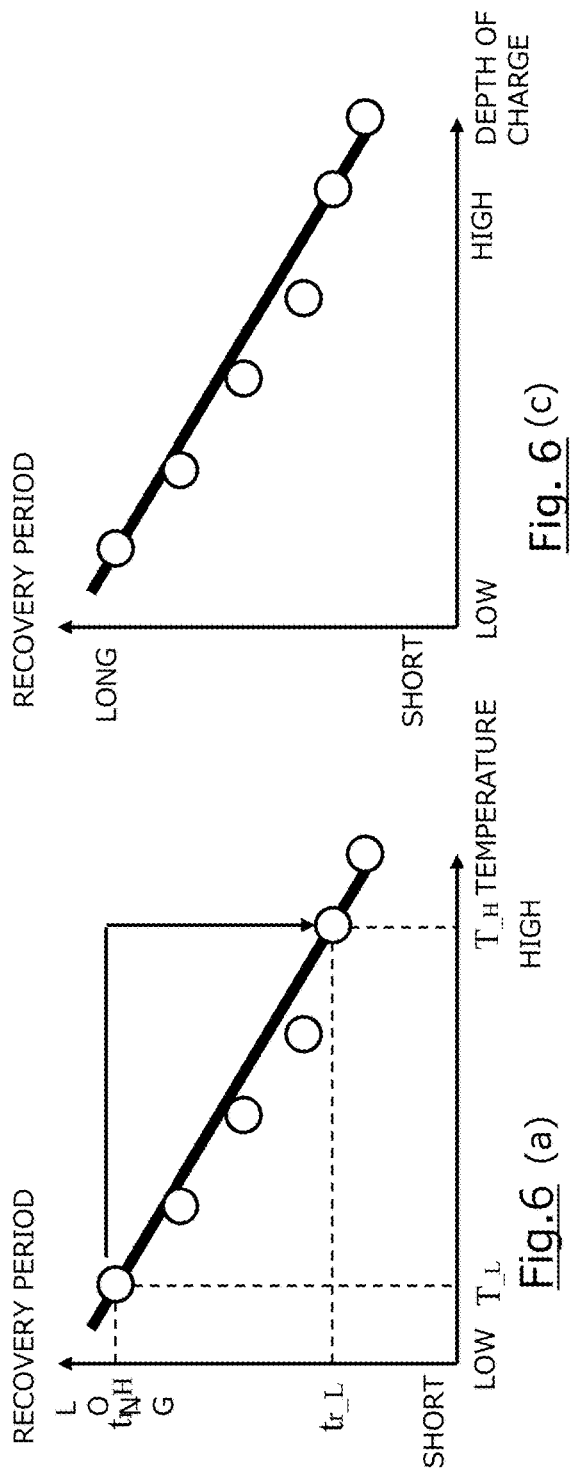
Fig.6 (a)
Fig. 6 (c)
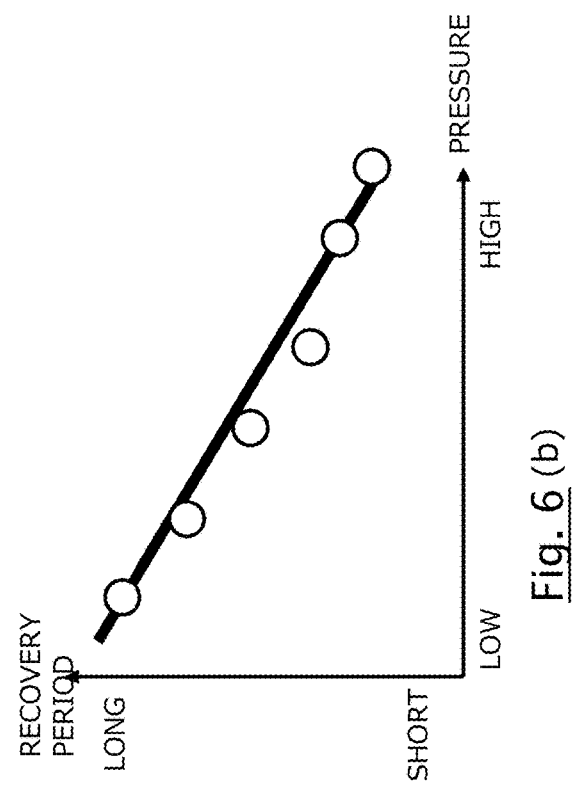
Fig. 6 (b)

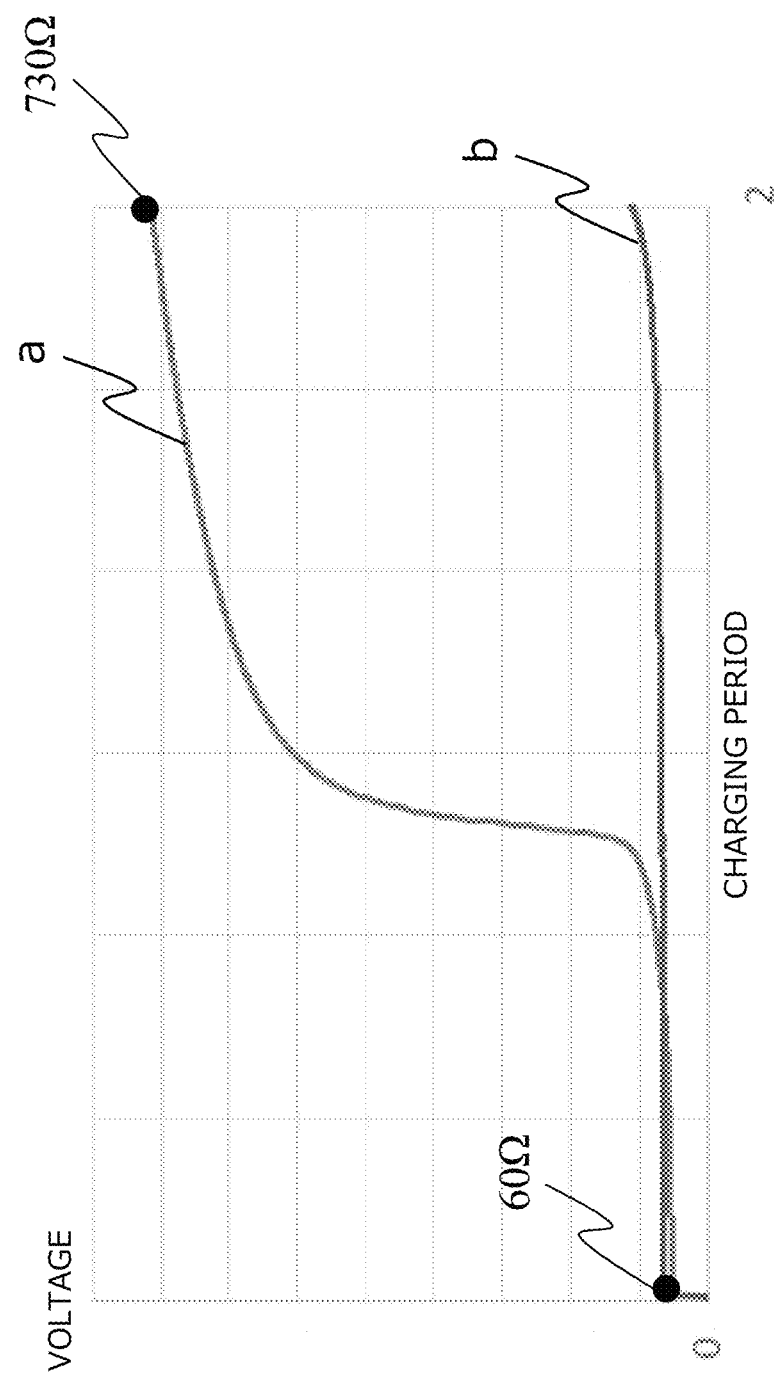

RECOVERY CONTROL METHOD FOR SECONDARY BATTERY, RECOVERY CONTROL SYSTEM FOR SECONDARY BATTERY, AND VEHICLE CONTROL SYSTEM

TECHNICAL FIELD

The present invention relates to a recovery control method for a secondary battery, a recovery control system for a secondary battery, and a vehicle control system.

BACKGROUND

Conventionally, there has been known a state detection method of detecting a state of a lithium secondary battery (JP-A-2012-212513). In the state detection method disclosed in JP-A-2012-212513, a battery is discharged to SOC 10% or less, an impedance of the discharged battery is measured, and a real part and an imaginary part of the impedance are plotted on plane coordinates to obtain an impedance circle from which a reaction resistance value is calculated. When the calculated reaction resistance value exceeds a preliminarily determined threshold value, it is determined that the battery is deteriorated.

SUMMARY

Now, in the case where an all-solid lithium secondary battery using a solid electrolyte is charged and discharged, there is sometimes generated a gap (hereinafter referred to as a "void") in an interface portion between a lithium metal or a lithium alloy and the solid electrolyte during a dissolution-deposition reaction of the lithium metal or the lithium alloy used as a negative electrode active material. Once the void is generated, a part of the void is a non-contact portion with the solid electrolyte, and therefore, a reaction area reduces to cause an increase in voltage in association with an increase in resistance of the secondary battery.

However, the method in the prior art described above ensures detecting an increase in resistance of an all-solid lithium secondary battery, but discloses no method of reducing a resistance increase caused by a void, and thus, there lies a problem that a performance of the secondary battery is not recoverable when the resistance increases due to the void.

An object that the present invention attempts to achieve is to provide a recovery control method, a recovery control system, and a vehicle control system that ensure recovering a performance of a secondary battery when the resistance of the secondary battery increases due to a void.

The present invention solves the above-described problem by calculating a recovery limit resistance value indicating an upper limit value of resistance that ensures recovering a secondary battery from a depth of charge/discharge of the secondary battery, a cell temperature of the secondary battery, and a pressure applied to the secondary battery, and inhibiting charging/discharging of the secondary battery and executing recovery control that recovers the secondary battery when a resistance value of cell resistance is equal to or less than the recovery limit resistance value.

With the present invention, when the resistance of a secondary battery increases due to a void, the resistance increase of the secondary battery is reduced, and thus, a performance of the secondary battery is recoverable.

BRIEF DESCRIPTION OF THE DRAWINGS

FIGS. 6(a) to 6(c) are graphs illustrating relations between execution parameters of recovery control and a recovery period in the recovery control system for the secondary battery according to the embodiment;

FIG. 11 is a drawing for describing evaluation results of an example and a graph illustrating characteristics between the charging period and a voltage.

DETAILED DESCRIPTION

Figure 1:
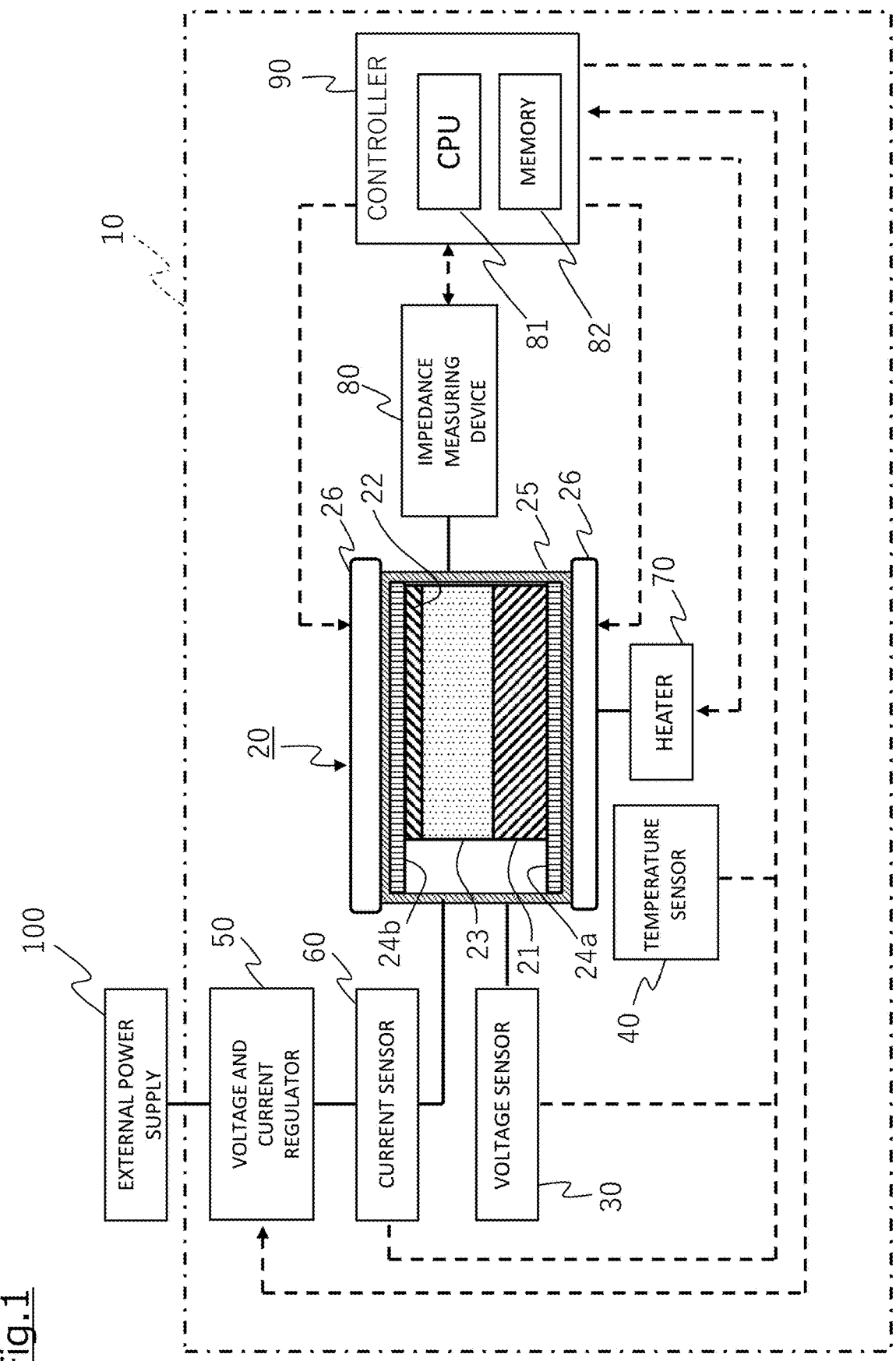
FIG. 1 is a block diagram illustrating a recovery control system for a secondary battery according to an embodiment.

FIG. 1 is a drawing illustrating a configuration of a recovery control system for a secondary battery according to an embodiment. The recovery control system for the secondary battery according to the embodiment is a system for recovering a battery performance by squashing a void when the void is generated within an all-solid lithium secondary battery to improve contact of an interface.

As illustrated in FIG. 1, a recovery control system 10 includes a secondary battery 20, a voltage sensor 30, a temperature sensor 40, a voltage and current regulator 50, a current sensor 60, a heater 70, an impedance measuring device 80, and a controller 90. The recovery control system 10 illustrated in FIG. 1 is a system for charging the secondary battery 20 with electric power of an external power supply 100 or discharging the secondary battery 20, and recovers the secondary battery 20 while the charging/discharging of the secondary battery 20 is inhibited.

The secondary battery (a battery cell) 20 is an all-solid lithium secondary battery, and includes a power generating element including a positive electrode 21 including a positive electrode active material layer containing a positive electrode active material that can absorb/discharge lithium ions, a negative electrode 22 including a negative electrode active material layer containing a negative electrode active material that can absorb/discharge the lithium ions, and a solid electrolyte 23 interposed between the positive electrode active material layer and the negative electrode active material layer. Besides the power generating element, the secondary battery 20 includes electrode tabs 24a, 24b, an exterior member 25 that houses the power generating element, and a cell fastening member 26.

The positive electrode 21 includes at least one positive electrode layer, and the positive electrode layer is formed of a positive electrode side current collector and the positive electrode active material layer formed on a main surface of a part of the positive electrode side current collector. The positive electrode side current collector is joined to the electrode tab 24a, and for example, can be configured of electrochemically-stable metal foil, such as aluminum foil, aluminum alloy foil, copper titanium foil, or stainless steel foil. For the positive electrode side current collector, nickel, iron, copper, or the like may be used as a metal. Other than them, a clad material of nickel and aluminum, a clad material of copper and aluminum, or the like may be used.

For the positive electrode side current collector, a resin with a conductive property may be used instead of the metals. The resin with the conductive property can be configured of a resin in which a conductive filler is added to a non-conductive high-polymer material as necessary. For the non-conductive high-polymer material, a material with excellent potential resistance, such as polyethylene (PE; for example, high-density polyethylene (HDPE) and low-density polyethylene (LDPE)), polypropylene (PP), and polyethylene terephthalate (PET), is used. For the conductive filler, any material with a conductive property can be used without any specific limitation. Examples of a material with an excellent conductive property, potential resistance, or lithium ion barrier property include a metal and conductive carbon. While the metal is not particularly limited, examples of the metal include at least one metal selected from the group consisting of Ni, Ti, Al, Cu, Pt, Fe, Cr, Sn, Zn, In, and Sb or an alloy containing these metals, or a metal oxide thereof.

While the positive electrode active material layer configuring the positive electrode layer is not particularly limited, examples of the positive electrode active material layer include a layered rock-salt type active material, such as $LiCoO_2$, $LiMnO_2$, $LiNiO_2$, $LiVO_2$, and $Li(Ni-Mn-Co)O_2$, a spinel type active material, such as $LiMn_2O_4$ and $LiNi_{0.5}Mn_{1.5}O_4$, an olivine type active material, such as $LiFePO_4$ and $LiMnPO_4$, and a Si-containing active material, such as $Li_2FeSiO_4$ and $Li_2MnSiO_4$. Examples of an oxide active material other than the above include $Li_4Ti_5O_{12}$. A composite oxide containing lithium and nickel is preferably used, and more preferably, $Li(Ni-Mn-Co)O_2$ and those with parts of these transition metals replaced by other elements (hereinafter also simply referred to as an "NMC composite oxide") are used. The NMC composite oxide also includes composite oxides with parts of transition metal elements replaced by other metal elements as described above. Examples of the other elements in such a case include Ti, Zr, Nb, W, and P.

For the positive electrode active material layer, a sulfur-based positive electrode active material may be used. Examples of the sulfur-based positive electrode active material include a particle or a thin film of an organic sulfur compound or an inorganic sulfur compound, and the sulfur-based positive electrode active material needs to be a substance that can discharge lithium ions during charging and absorb the lithium ions during discharging using a redox reaction of sulfur. Examples of the organic sulfur compound include a disulfide compound and sulfur-modified polyacrylonitrile. Examples of the inorganic sulfur compound include sulfur (S), a S-carbon composite, $TiS_2$, $TiS_3$, $TiS_4$, NiS, $NiS_2$, CuS, $FeS_2$, $Li_2S$, $MoS_2$, and $MoS_3$.

Note that a positive electrode active material other than the above may be used. Examples of a shape of the positive electrode active material include shapes of a particle (a spherical shape, a fiber-like shape) and a thin film. A content of the positive electrode active material in the positive electrode active material layer is not specifically limited. The positive electrode active material layer may further contain at least one of a solid electrolyte, a conductive agent, and a binder as necessary. Examples of the solid electrolyte include a sulfide solid electrolyte and an oxide solid electrolyte, and those exemplarily illustrated as a solid electrolyte that can configure the solid electrolyte 23, which will be described later, can be used.

While the conductive agent is not specifically limited, one with a particle shape or a fiber-like shape is preferable. When the conductive agent has the particle shape, a shape of a particle is not specifically limited, and may be any shape, such as a powder form, a spherical shape, a rod shape, a needle shape, a plate shape, a pillar shape, an irregular shape, a scale shape, and a spindle shape.

An average particle diameter (a primary particle diameter) when the conductive agent is in the particle shape is not specifically limited, but from an aspect of electric properties of a battery, it is preferred to be 0.01 µm to 10 µm.

Examples of the binder include: a thermoplastic polymer, such as polybutylene terephthalate, polyethylene terephthalate, polyvinylidene fluoride (PVDF) (including compounds in which hydrogen atoms are replaced by other halogen elements), polyethylene, polypropylene, polymethylpentene, polybutene, polyether nitrile, polytetrafluoroethylene, polyacrylonitrile, polyimide, polyamide, an ethylene-vinyl acetate copolymer, polyvinyl chloride, styrene-butadiene rubber (SBR), an ethylene-propylene-diene copolymer, a styrene-butadiene-styrene block copolymer and its hydrogen additive, and a styrene-isoprene-styrene block copolymer and its hydrogen additive; a fluorine resin, such as a tetrafluoroethylene-hexafluoropropylene copolymer (FEP), a tetrafluoroethylene-perfluoroalkyl vinyl ether copolymer (PFA), an ethylene-tetrafluoroethylene copolymer (ETFE), polychlorotrifluoroethylene (PCTFE), an ethylene-chlorotrifluoroethylene copolymer (ECTFE), and polyvinyl fluoride (PVF); vinylidene fluoride-based fluorine rubber, such as vinylidene fluoride-hexafluoropropylene-based fluorine rubber (VDF-HFP-based fluorine rubber), vinylidene fluoride-hexafluoropropylene-tetrafluoroethylene-based fluorine rubber (VDF-HFP-TFE-based fluorine rubber), vinylidene fluoride-pentafluoropropylene-based fluorine rubber (VDF-PFP-based fluorine rubber), vinylidene fluoride-pentafluoropropylene-tetrafluoroethylene-based fluorine rubber (VDF-PFP-TFE-based fluorine rubber), vinylidene fluoride-perfluoromethyl vinyl ether-tetrafluoroethylene-based fluorine rubber (VDF-PFMVE-TFE-based fluorine rubber), and vinylidene fluoride-chlorotrifluoroethylene-based fluorine rubber (VDF-CTFE-based fluorine rubber); and an epoxy resin. Among them, polyimide, styrene-butadiene rubber, carboxymethyl cellulose, polypropylene, polytetrafluoroethylene, polyacrylonitrile, and polyamide are more preferred.

The negative electrode 22 includes at least one negative electrode layer, and the negative electrode layer is formed of a negative electrode side current collector and a negative electrode active material layer formed on a main surface of a part of the negative electrode side current collector. The negative electrode side current collector is joined to the electrode tab 24b, and is, for example, electrochemically-stable metal foil, such as nickel foil, copper foil, stainless steel foil, or iron foil.

Examples of the negative electrode active material layer include a metallic active material containing at least Li. For the metallic active material, a metal containing Li is used. Such a metallic active material is not specifically limited as long as it is an active material containing Li, and its examples include a Li-containing alloy other than the Li metal.

Examples of the lithium alloy include an alloy of lithium and at least one metal selected from gold (Au), magnesium (Mg), aluminum (Al), calcium (Ca), zinc (Zn), tin (Sn), and bismuth (Bi). The lithium alloy may be an alloy of lithium and two or more metals of the above-described metals. Specific examples of the lithium alloy include, for example, a lithium-gold alloy (Li—Au), a lithium-magnesium alloy (Li—Mg), a lithium-aluminum alloy (Li—Al), a lithium-calcium alloy (Li—Ca), a lithium-zinc alloy (Li—Zn), a lithium-tin alloy (Li—Sn), and a lithium-bismuth alloy (Li—Bi).

Note that when the negative electrode active material layer contains the lithium alloy, its configuration is not specifically limited, but for example, when the metal other than lithium constituting the lithium alloy is "Me," the aspect can be any of the following (1) to (3).

(1) one formed of a single layer made only of a lithium alloy (that is, a Li-Me layer)

(2) one including a layer made of the lithium metal and a layer made of a lithium alloy (that is, a Li layer/Li-Me layer)

(3) one including a layer made of the lithium metal, a layer made of a lithium alloy, and a layer made of a metal other than lithium (that is, a Li layer/Li-Me layer/Me layer)

In the above-described aspect (2), the layer made of the lithium alloy (the Li-Me layer) is preferred to be a layer on a side of the solid electrolyte 23 (a layer that forms an interface with the solid electrolyte 23), and in the above-described aspect (3), the layer made of the metal other than lithium (the Me layer) is preferred to be the layer on the solid electrolyte 23 side (the layer that forms the interface with the solid electrolyte 23). When the lithium metal layer containing the lithium metal and the layer (a middle layer) containing the metal different from the lithium metal are employed, the middle layer is a layer between the lithium metal layer and the solid electrolyte, and at least a part of the lithium metal and at least a part of the metal forming the middle layer are preferred to be alloyed.

For example, when the negative electrode is in the above-described aspect (3), that is, in the aspect including the layer made of the lithium metal, the layer made of the lithium alloy, and the layer made of the metal other than lithium (that is, the Li layer/Li-Me layer/Me layer), the lithium metal and the metal other than lithium are stacked to alloy their interface portion, and thus, the layer made of the lithium alloy can be formed in their interface. Note that while a method of stacking the lithium metal and the metal other than lithium is not specifically limited, there is a method that alloys their interface while depositing the metal other than lithium on the layer made of the lithium metal by vacuum evaporation or the like to form the layer made of the metal other than lithium on the layer made of the lithium metal. Alternatively, there is a method that alloys their interface while depositing the lithium metal on the layer made of the metal other than lithium by vacuum evaporation or the like to form the layer made of the lithium metal on the layer made of the metal other than lithium.

The solid electrolyte 23 of the power generating element is intended to prevent a short circuit between the positive electrode 21 and the negative electrode 22 described above, and is a layer interposed between the positive electrode active material layer and the negative electrode active material layer described above. While examples of the solid electrolyte 23 include a sulfide solid electrolyte, an oxide solid electrolyte, and a polymer solid electrolyte, it is preferred to be the sulfide solid electrolyte.

Examples of the sulfide solid electrolyte include LiI—$Li_2S$—$SiS_2$, LiI—$Li_2S$—$P_2O_5$, LiI—$Li_3PO_4$—$P_2S_5$, $Li_2S$—$P_2S_5$, LiI—$Li_3PS_4$, LiI—LiBr—$Li_3PS_4$, $Li_3PS_4$, $Li_2S$—$P_2S_5$, $Li_2S$—$P_2S_5$—LiI, $Li_2S$—$P_2S_5$—$Li_2O$, $Li_2S$—$P_2S_5$—$Li_2O$LiI, $Li_2S$—$SiS_2$, $Li_2S$—$SiS_2$—LiI, $Li_2S$—$SiS_2$—LiBr, $Li_2S$—$SiS_2$—LiCl, $Li_2S$—$SiS_2$—$B_2S_3$—LiI, $Li_2S$—$SiS_2$—$P_2S_5$—LiI, $Li_2S$—$B_2S_3$, $Li_2S$—$P_2S_5$-ZmSn (however, m and n are positive numbers, and Z is any of Ge, Zn, and Ga), $Li_2S$—$GeS_2$, $Li_2S$—$SiS_2$—$Li_3PO_4$, and $Li_2S$—$SiS_2$—LixMOy (however, x and y are positive numbers, and M is any of P, Si, Ge, B, Al, Ga, and In). Note that "$Li_2S$—$P_2S_5$" means a sulfide solid electrolyte made using a raw material composition containing $Li_2S$ and $P_2S_5$, and the same also applies to the others.

The sulfide solid electrolyte, for example, may have a $Li_3PS_4$ framework, may have a $Li_4P_2S_7$ framework, or may have a $Li_4P_2S_6$ framework. Examples of the sulfide solid electrolyte having the $Li_3PS_4$ framework include LiI—$Li_3PS_4$, LiI—LiBr—$Li_3PS_4$, and $Li_3PS_4$. Examples of the sulfide solid electrolyte having the $Li_4P_2S_7$ framework include a Li—P—S-based solid electrolyte referred to as LPS (for example, $Li_7P_3S_{11}$). For the sulfide solid electrolyte, for example, LGPS or the like represented by $Li_{(4-x)}Ge_{(1-x)}P_xS_4$ (x satisfies 0<x<1) may be used. Among others, the sulfide solid electrolyte is preferred to be a sulfide solid electrolyte containing a P element, and the sulfide solid electrolyte is more preferred to be a material having $Li_2S$—$P_2S_5$ as a main component. Furthermore, the sulfide solid electrolyte may contain a halogen (F, Cl, Br, I).

When the sulfide solid electrolyte is $Li_2S$—$P_2S_5$-based, the proportion of $Li_2S$ to $P_2S_5$ is preferred to be in a range of $Li_2S:P_2S_5$=50:50 to 100:0 in a mole ratio, and among others, it is preferred to be $Li_2S:P_2S_5$=70:30 to 80:20. The sulfide solid electrolyte may be a sulfide glass, may be a crystallized sulfide glass, or may be a crystalline material obtained by a solid phase method. Note that the sulfide glass can be obtained, for example, by performing mechanical milling (for example, a ball mill) on a raw material composition. The crystallized sulfide glass can be obtained, for example, by performing a heat treatment on the sulfide glass at a temperature equal to or more than the crystallization temperature. An ionic conductivity (for example, a Li ionic conductivity) at a normal temperature (25° C.) of the sulfide solid electrolyte, for example, is preferred to be $1 \times 10^{-5}$ S/cm or more, and is more preferred to be $1 \times 10^{-4}$ S/cm or more. Note that a value of the ionic conductivity of the solid electrolyte 23 can be measured by an alternating current impedance method.

Examples of the oxide solid electrolyte include a compound having a NASICON-type structure. Examples of the compound having the NASICON-type structure include a compound (LAGP) represented by the general formula $Li_{1+x}Al_xGe_{2-x}(PO_4)_3$ (0≤x≤2) and a compound (LATP) represented by the general formula $Li_{1+x}Al_xTi_{2-x}(PO_4)_3$ (0≤x≤2). Other examples of the oxide solid electrolyte include LiLaTiO (for example, $Li_{0.34}La_{0.51}TiO_3$), LiPON (for example, $Li_{2.9}PO_{3.3}N_{0.46}$), and LiLaZrO (for example, $Li_7La_3Zr_2O_{12}$).

The solid electrolyte 23 may further contain a binder in addition to the above-described electrolyte. While the binder is not specifically limited, for example, one described above can be used.

A content of the solid electrolyte is, for example, preferred to be in a range of 10 mass % to 100 mass %, more preferred to be in a range of 50 mass % to 100 mass %, and even more preferred to be in a range of 90 mass % to 100 mass %.

As illustrated in FIG. 1, the positive electrode 21 and the negative electrode 22 are stacked via the solid electrolyte 23. Note that the positive electrode 21 and the negative electrode 22 are not limited to a single layer but may be a plurality of layers, and when the plurality of layers are stacked, the positive electrode layers and the negative electrode layers need to be alternately stacked while interposing the layers of the solid electrolyte 23 between the positive electrode layers and the negative electrode layers.

The electrode tabs 24a, 24b are members for making an electrical connection with an outside of the secondary battery 20, and aluminum foil, aluminum alloy foil, copper foil, nickel foil, or the like can be used.

The power generating element configured as described above is housed and sealed in the exterior member 25. The exterior member 25 is, for example, formed of a material having flexibility, such as a resin-metal thin film laminate material made by laminating both surfaces of a resin film of polyethylene, polypropylene, or the like, or metal foil of aluminum or the like, with a resin, such as polyethylene and polypropylene. Heat-sealing the exterior member 25 on the upper side and the exterior member 25 on the lower side ensures sealing the power generating element with the electrode tab 24a and the electrode tab 24b being extracted outside.

The cell fastening member 26 applies a surface pressure from top and inferior surfaces of the secondary battery 20 to fasten the secondary battery 20. The cell fastening member 26 is configured of an elastic body and the like, such as a leaf spring. The secondary battery 20 receives a pressure in a lamination direction from the cell fastening member 26 during charging/discharging. As described later, in this embodiment, the secondary battery 20 receives the pressure in the lamination direction from the cell fastening member 26 also during recovery control of the secondary battery 20.

The voltage sensor 30 is a sensor for detecting input and output voltages of the secondary battery 20, and detects a cell voltage (an inter-terminal voltage) between the positive electrode and the negative electrode of the secondary battery 20. A connection position of the voltage sensor 30 is not specifically limited, and it is only necessary to be a position where the cell voltage between the positive electrode and the negative electrode can be detected within a circuit connected to the secondary battery 20.

The temperature sensor 40 detects an outer surface temperature (a cell temperature) of the secondary battery 20. The temperature sensor 4 is, for example, attached to a surface or the like of a case (an exterior body, a housing) of the secondary battery 20.

The voltage and current regulator 50 is a circuit for adjusting a battery current and a battery voltage during charging and/or during discharging of the secondary battery 20, and adjusts the current/voltage of the secondary battery 20 based on a command from the controller 90. The voltage and current regulator 50 includes a voltage conversion circuit or the like for converting electric power output from the external power supply 100 into a charging voltage of the secondary battery.

The current sensor 60 is a sensor for detecting input and output currents of the secondary battery 20. The current sensor 60 detects a current supplied from the voltage and current regulator 50 to the secondary battery 20 during the charging of the secondary battery 20, and detects a current supplied from the secondary battery 20 to the voltage and current regulator 50 during the discharging.

The heater 70 is a device that increases a temperature of the secondary battery 20. The heater 70 is installed in the proximity of the secondary battery 20.

The impedance measuring device 80 applies an AC perturbation current formed of a single frequency component as an input signal to the secondary battery 20 in a predetermined cycle based on a control command from the controller 90, and obtains a response voltage corresponding to this AC perturbation current, and thus measures an alternating current impedance (a complex impedance) of the secondary battery 20. The impedance measuring device 80 outputs the measurement result to the controller 90.

The controller 90 is a control device including a CPU 91, a memory 82, and the like. The controller 90 calculates cell resistance of the secondary battery 20 from the measurement result of the impedance measuring device 80, and calculates a recovery limit resistance value from a depth of charge/discharge of the secondary battery 20, the cell temperature of the secondary battery 20, and a fastening force (a pressure) applied to the secondary battery 20, and when a resistance value of the detected cell resistance is equal to or less than the recovery limit resistance value, the controller 90 inhibits the charging/discharging of the secondary battery 20, and executes the recovery control that recovers the secondary battery 20. The recovery limit resistance value and the recovery control of the secondary battery 20 will be described in detail later. The controller 90 controls the charging/discharging of the secondary battery 20 based on the inter-terminal voltage of the secondary battery 20 detected by the voltage sensor 30 and the charge/discharge current flowing in the secondary battery 20 detected by the current sensor 60.

The external power supply 100 is a power source for charging the secondary battery 20. For the power source, for example, an AC power source of three-phase 200 V is used. The external power supply 100 may be an AC power source of single-phase 100 V or single-phase 200 V. The external power supply 100 is not limited to an alternate current, and may be a DC power source.

Next, a charge control method for the secondary battery 20 according to the embodiment and a recovery control method for the secondary battery 20 will be described. In this embodiment, the voltage and current regulator 50 and the controller 90 execute charge control of the secondary battery 20 described below. The cell fastening member 26, the heater 70, and the controller 90 execute the recovery control of the secondary battery 20. The recovery control of the secondary battery 20 is executed while the charging/discharging of the secondary battery 20 is inhibited.

First, the charge control of the secondary battery 20 will be described. In this embodiment, the controller 90 gradually increases the current until the charging voltage of the secondary battery 20 reaches a predetermined upper limit voltage, and when a charging current of the secondary battery 20 reaches a set current, a current value is kept constant (what is called constant current control; a CC charge). During the charging of the secondary battery 20, the controller 90 obtains detection values from the voltage sensor 30 and the current sensor 60 so as to manage the current flowing in the secondary battery 20 and the voltage applied to the secondary battery 20. The controller 90 also manages a state of charge (SOC) of the secondary battery 20 based on the detection voltage of the voltage sensor 30. In this embodiment, charging the secondary battery 20 at the set current increases the SOC of the secondary battery 20 and gradually increases the voltage of the secondary battery 20.

When the voltage of the secondary battery 20 reaches the upper limit voltage, the controller 90 performs a constant voltage charge (a CV charge) at the upper limit voltage. With the voltage of the secondary battery 20 being maintained at the upper limit voltage, the charging current attenuates in association with the increase of the SOC of the secondary battery 20. In this embodiment, when the charging current continues to attenuate to lower to a cut-off current value, the charging of the secondary battery 20 is terminated. In this embodiment, the charge control of the secondary battery 20 is thus performed. Note that the charging method is not limited to what is called a CC-CV charge as described above, and may be another type of charging method.

Next, the recovery control of the secondary battery 20 will be described. In this embodiment, in order to detect a state of the secondary battery 20, the cell resistance of the secondary battery 20 is firstly measured. The cell resistance of the secondary battery 20 is what is called internal resistance, and is calculated from the measurement result of the impedance measuring device 80 during the charging/discharging of the secondary battery 20. Since the measuring method of the alternating current impedance can distinguish between electrolyte resistance and reaction resistance and measure them, it is only necessary to appropriately select a resistance value easily changed by a void generated in the negative electrode, and calculate the cell resistance. Note that the calculation method of the cell resistance is not limited to the AC impedance measurement method, and any other well-known method may be used. The controller 90 may directly use the measurement result of the impedance measuring device 80 as the cell resistance of the secondary battery 20.

Repeating a charge-discharge cycle of the secondary battery 20 generates a void in the negative electrode containing the lithium metal or the lithium alloy (note that, in the following description, the lithium metal or the lithium alloy are simply referred to as the "lithium metal") as the negative electrode active material, and reduces a reaction area, and therefore, there is generated a phenomenon that increases the cell resistance of the secondary battery 20. In this embodiment, in order to predict this generation of the void, the cell resistance of the secondary battery 20 is measured.

What is called the all-solid battery like the secondary battery 20 uses a solid body to transport ions, and therefore, contact between materials needs to be good. When the secondary battery 20 is discharged or charged, a void is generated in an interface portion between the lithium metal and the solid electrolyte due to physical or chemical non-uniformity during a dissolution-deposition reaction of the lithium metal. That is, a portion that becomes ions by dissolution of the lithium metal is depressed to be the void. The generated void makes a non-contact portion with the solid electrolyte, which reduces the reaction area in the interface portion. Caused by this, the cell resistance of the secondary battery 20 increases. In association with the resistance increase, the voltage of the secondary battery 20 increases (overvoltage).

The following formula (1) indicates a calculation formula of the internal resistance of the secondary battery 20. However, R indicates a resistance value of the cell resistance, ρ indicates resistivity of the solid electrolyte, l indicates a distance between the electrodes, and A indicates a reaction area.

[Math. 1]

$$R = \rho \frac{1}{A} \quad (1)$$

When the void is generated, a contact area in the interface portion between the negative electrode and the solid electrolyte reduces, and therefore, the reaction area (A) reduces. As shown in formula (1), the reduced reaction area A decreases the cell resistance (R). That is, detecting that the cell resistance has increased by measuring the cell resistance ensures predicting the generation of the void.

In this embodiment, what is called a creep phenomenon that deforms the lithium metal is caused by applying a pressure to the negative electrode 22 containing the lithium metal. The lithium metal ductilely deforms, which squashes the void to recover smoothness of a lithium metal surface, thereby improving contact of the interface. That is, in this embodiment, after detecting the void generation from the cell resistance of the secondary battery 20, the creep phenomenon of the lithium metal and the surface pressure applied to the secondary battery 20 are used to fill the void made in the interface between the lithium metal and the solid electrolyte, and thus, the cell resistance is lowered. This reduces an increase in voltage of the secondary battery 20, and thus, a performance of the secondary battery 20 can be recovered.

Figure 2:
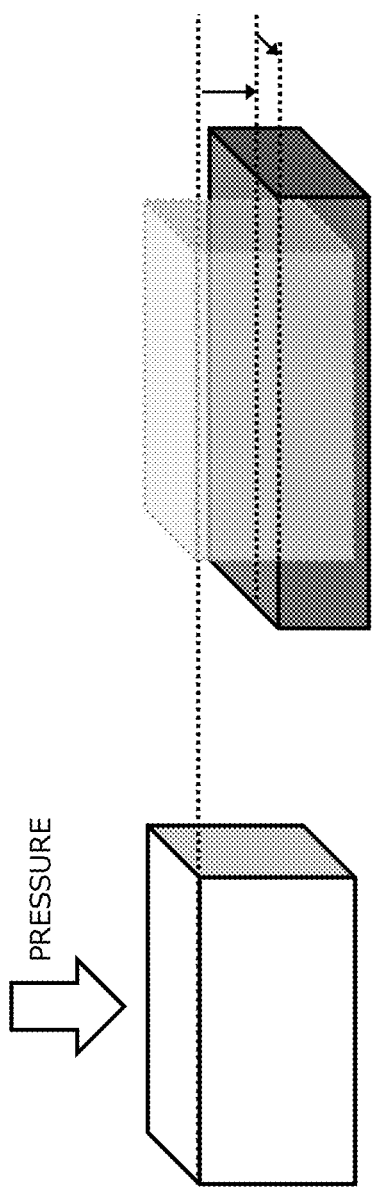
FIGS. 2(a) and 2(b) are conceptual diagrams for describing a creep deformation of a lithium metal.

The controller 90 calculates the recovery limit resistance value that indicates the upper limit value of the resistance that ensures recovering the secondary battery 20. In this embodiment, since the recovery control is performed using the creep phenomenon of the lithium metal, the recovery limit resistance value corresponds to a creep amount of the lithium metal. With reference to FIGS. 2(*a*) and 2(*b*), the creep amount of the lithium metal will be described. FIGS. 2(*a*) and 2(*b*) are conceptual diagrams for describing the creep amount of the lithium metal. FIG. 2(*a*) illustrates a state of the lithium metal when a pressure equal to or more than a pressure that causes the creep phenomenon is not applied to the lithium metal, and FIG. 2(*b*) illustrates a state of the lithium metal when the pressure equal to or more than the pressure that causes the creep phenomenon is applied to the lithium metal.

Applying a pressure to the lithium metal ductilely deforms the lithium metal. In the example in FIGS. 2(*a*) and 2(*b*), the lithium metal receives a surface pressure with a z-direction as a normal direction, and the lithium metal deforms to expand in an xy-direction. A volume of the lithium metal by a moving amount to fill the void caused by the deformation of the lithium metal corresponds to the creep amount. The creep amount is determined by a magnitude of the pressure applied to the secondary battery 20, a temperature of the secondary battery 20, and a thickness (a film thickness) of the lithium metal. A deformation amount of the lithium metal increases as the pressure applied to the secondary battery 20 increases, and therefore, the creep amount increases. The lithium metal becomes flexible when the temperature of the secondary battery 20 increases, and therefore, the creep amount increases. The deformation amount of the lithium metal increases as the thickness of the lithium metal increases, and therefore, the creep amount increases. That is, the creep amount increases as the pressure applied to the secondary battery 20 increases, the creep amount increases as the temperature of the secondary battery 20 increases, and the creep amount increases as the thickness of the lithium metal increases.

The creep amount has an upper limit value. For example, assume that the state of the lithium metal illustrated in FIG. 2(b) is a limit state of the deformation. As illustrated in FIG. 2(b), the lithium metal ductilely deforms in an x-direction and a y-direction. The creep amount corresponds to a volume of the ductilely deformed portion in the x-direction and the y-direction. The creep phenomenon moves the lithium metal to fill the void, and thus, a contact area between the lithium metal and the solid electrolyte increases. Since this contact area serves as a bottom area that determines solid electrolyte resistance, the increase of the contact area reduces the cell resistance of the secondary battery 20. When the expanded contact area is maximized in the interface between the lithium metal and the solid electrolyte caused by the ductile deformation of the lithium metal at the upper limit value of the creep amount, the upper limit value (the recovery limit resistance value) of the resistance that ensures recovering the secondary battery 20 (the resistance that can be reduced in the recovery control) is reached. That is, when the lithium metal deforms with the limit creep amount, the recovery limit resistance value is determined from the expanded contact area in the interface between the lithium metal and the solid electrolyte. Since the creep amount is determined by the magnitude of the pressure applied to the secondary battery 20, the temperature of the secondary battery 20, and the thickness (the film thickness) of the lithium metal, the recovery limit resistance value is also determined from their relations. Furthermore, since dissolution-deposition of lithium ions occurs from the lithium metal corresponding to the charging/discharging of the secondary battery 20, the thickness of the lithium metal has a correlation with the depth of charge/discharge of the secondary battery 20. Therefore, the recovery limit resistance value of the secondary battery 20 is determined by the magnitude of the pressure applied to the secondary battery 20, the temperature of the secondary battery 20, and the depth of charge/discharge of the secondary battery 20.

The controller 90 preliminarily stores a map (hereinafter referred to as a "recovery limit resistance value map") showing a correlation between the magnitude of the pressure applied to the secondary battery 20, the cell temperature of the secondary battery 20, and the depth of charge/discharge of the secondary battery 20, and the recovery limit resistance value in a memory 92. Note that the correlation shown in the recovery limit resistance value map are experimentally determined in advance depending on materials and the like used in the negative electrode 22. The recovery limit resistance value indicates the upper limit of the resistance value that ensures the recovery with an initial value of the cell resistance of the secondary battery 20 as a starting point. The controller 90 manages the state of charge (SOC) of the secondary battery 20 using the detection values of the voltage sensor 30 and the current sensor 60 during the charging/discharging of the secondary battery 20. When the recovery limit resistance value is calculated during the charging/discharging of the secondary battery 20, the controller 90 needs to use the managing SOC as the depth of charge/discharge for calculating the recovery limit resistance value. The controller 90 may calculate the recovery limit resistance value when the charging/discharging is terminated or after the charging/discharging is terminated. When the recovery limit resistance value at the termination of the charging/discharging is calculated, the SOC or a depth of discharge (DOD) at a point when charge-discharge control is terminated does not necessarily have to be used, for example, when a target SOC is already determined, the controller 90 may use the target SOC as the depth of charge/discharge for calculating the recovery limit resistance value. Furthermore, the controller 90 may use the depth of discharge (DOD) at the termination of the discharging as the depth of charge/discharge for calculating the recovery limit resistance value. Note that the depth of charge/discharge needs to be indicated by at least one value of a state of charge (SOC) during the charging or at the termination of the charging of the secondary battery 20 or the depth of discharge (DOD) during the discharging or at the termination of the discharging of the secondary battery 20.

The controller 90 obtains the cell temperature of the secondary battery 20 from the temperature sensor 40, and calculates the recovery limit resistance value. The controller 90 also calculates the recovery limit resistance value using the pressure (a pressure value) applied to the secondary battery 20 by the cell fastening member 26. The controller 90 refers to the recovery limit resistance value map, and calculates the recovery limit resistance value corresponding to the depth of charge/discharge of the secondary battery 20, the cell temperature of the secondary battery 20, and the pressure applied to the secondary battery 20 in this map. The controller 90 sets a resistance threshold value for determining whether to execute the recovery control described later. The resistance threshold value is a value equal to or less than the recovery limit resistance value, and for example, is set to a value of 80% or 90% with respect to the recovery limit resistance value.

Next, the controller 90 calculates Δ cell resistance (the Δ cell resistance=the current cell resistance−the initial value of the cell resistance) from a difference between the initial value of the cell resistance and the current cell resistance of the secondary battery 20. The initial value of the cell resistance is, for example, a resistance value at the time of shipping of the secondary battery 20. The Δ cell resistance indicates a resistance value of an increased amount of the resistance from the initial value of the cell resistance. When a void is generated in the negative electrode containing the lithium metal, the cell resistance of the secondary battery 20 also increases, and therefore, the Δ cell resistance increases.

The controller 90 compares the Δ cell resistance with the resistance threshold value, and when the Δ cell resistance is equal to or more than the resistance threshold value, the controller 90 inhibits the charging/discharging of the secondary battery 20. For example, when calculating the Δ cell resistance during the charging/discharging of the secondary battery 20, the controller 90 cancels the charging/discharging of the secondary battery 20 at a point when the Δ cell resistance is equal to or more than the resistance threshold value. When calculating the Δ cell resistance and the recovery limit resistance value at the termination of the charging/discharging of the secondary battery 20, the controller 90 executes the recovery control before performing the next charge/discharge when the Δ cell resistance is equal to or more than the resistance threshold value.

Figure 3:
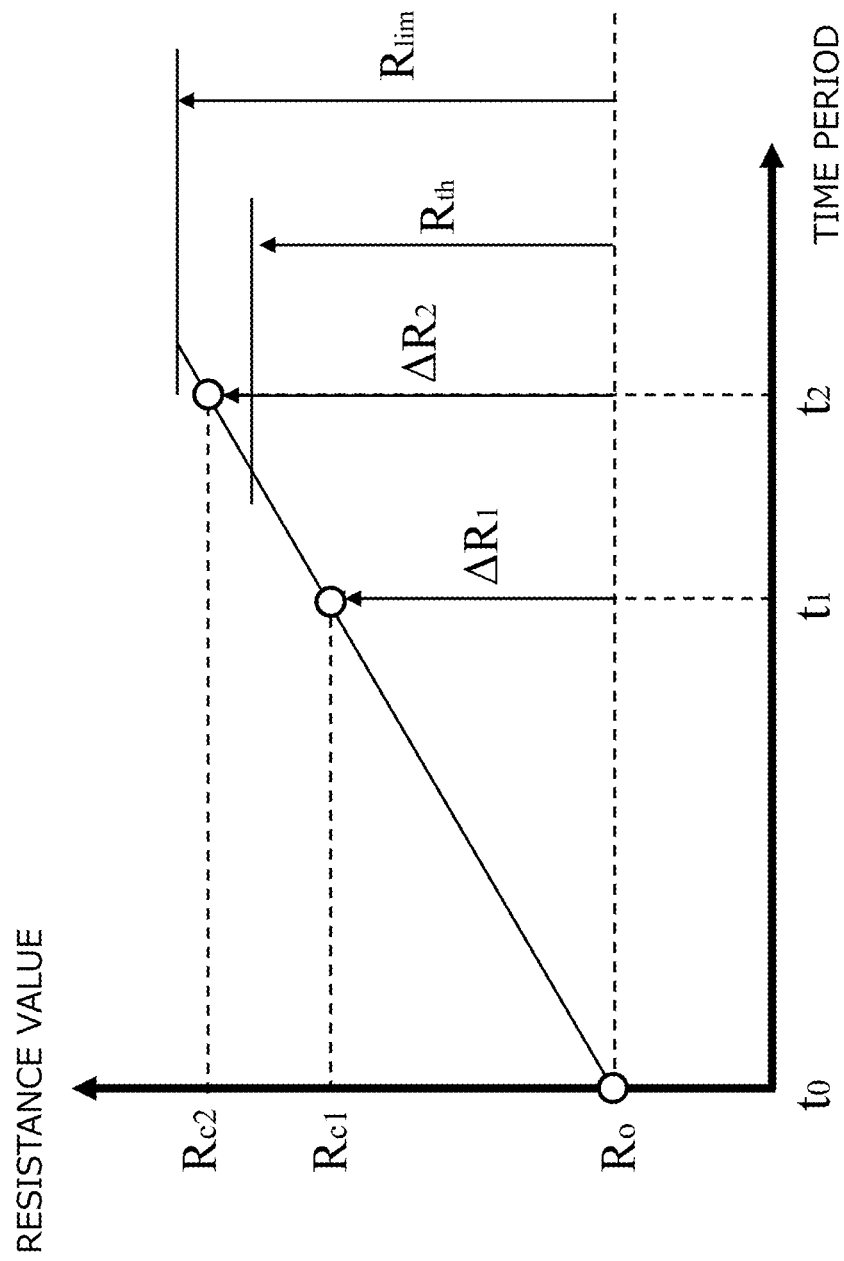
FIG. 3 is a graph for describing relations among a determination threshold value ($R_{th}$), a recovery limit resistance value ($R_{lim}$), Δ cell resistance (ΔR), an initial value ($R_o$) of cell resistance, and a current value ($R_c$) of the cell resistance.

FIG. 3 is a graph for describing relations among a determination threshold value ($R_{th}$), a recovery limit resistance value ($R_{lim}$), A cell resistance (ΔR), an initial value ($R_o$) of the cell resistance, and a current value ($R_c$) of the cell resistance. The vertical axis indicates a resistance value, and the horizontal axis indicates a used time of the secondary battery 20. The used time of the secondary battery 20 corresponds to the number of charge-discharge cycles. Note that the cell resistance of the secondary battery 20 does not necessarily increase in proportion to the used time, but in FIG. 3, the cell resistance of the secondary battery 20 is illustrated in a graph in which the cell resistance increases in proportion to the used time for ease of description.

The recovery limit resistance value ($R_{lim}$) indicates the upper limit of the resistance value that ensures the recovery with the initial value ($R_o$) of the cell resistance of the secondary battery 20 as a starting point. That is, in the example in FIG. 3, the secondary battery 20 can be recovered until the cell resistance of the secondary battery 20 increases by an amount of the recovery limit resistance value ($R_{lim}$) with respect to the initial value ($R_o$). The determination threshold value ($R_{th}$) is a value starting from the initial value ($R_o$), and is set to a value lower than the recovery limit resistance value ($R_{lim}$). The secondary battery 20 is used from time $t_0$, and the cell resistance of the secondary battery 20 is the initial value ($R_o$). When the used time passes, the cell resistance of the secondary battery 20 increases. At the point of time ($t_1$), the current value of the cell resistance of the secondary battery 20 is $R_{c1}$, and the Δ cell resistance is $\Delta R_1$ (=$R_{c1}-R_o$). At this time, the Δ cell resistance ($\Delta R_1$) is lower than the determination threshold value ($R_{th}$), and therefore, the controller 90 does not execute the recovery control. When the used time further passes and a void is generated, at the point of time ($t_2$), the current value of the cell resistance of the secondary battery 20 is $Rc_2$, and the Δ cell resistance is $\Delta R_2$ (=$R_{c2}-R_o$). At this time, the Δ cell resistance ($\Delta R_2$) is equal to or more than the determination threshold value ($R_{th}$), and therefore, the controller 90 executes the recovery control.

Thus, in the example in FIG. 3, the increase of the cell resistance caused by the void is detected from the difference between the initial value of the cell resistance and the current cell resistance, like the Δ cell resistance. Therefore, the recovery limit resistance value is indicated by the upper limit value with the initial value ($R_o$) of the cell resistance as the starting point. That is, in this embodiment, the Δ cell resistance is calculated as the resistance value of the cell resistance of the secondary battery 20, and the calculated resistance value is compared with the determination threshold value. Note that the increase of the cell resistance caused by the void may be detected from the magnitude of the cell resistance. Since the magnitude of the cell resistance is indicated by a value starting from zero, the recovery limit resistance value may also be an upper limit value starting from zero. The determination threshold value is also a threshold value starting from zero. The current value of the cell resistance of the secondary battery 20 is compared with the determination threshold value, and when the current value of the cell resistance is equal to or more than the determination threshold value, the controller 90 executes the recovery control. That is, in this embodiment, the current value of the cell resistance may be calculated as the resistance value of the cell resistance of the secondary battery 20, the calculated resistance value may be compared with the determination threshold value, and the recovery control may be executed corresponding to the comparison result.

The recovery control of the secondary battery 20 is executed by maintaining the state where the cell fastening member 26 applies a pressure to the secondary battery 20 for a predetermined recovery period. Note that the controller 90 may execute the recovery control of the secondary battery 20 by adjusting the heater 70 to increase the temperature of the secondary battery 20 while applying the pressure to the secondary battery 20. During the recovery control, the controller 90 controls the cell fastening member 26 such that the pressure equal to or more than the pressure causing the creep deformation of the lithium metal is applied to the secondary battery 20. Since the secondary battery 20 is used with the cell fastening member 26 applying the pressure to the secondary battery 20, in the recovery control, the pressure applied when the secondary battery 20 is used may be directly applied as the pressure for the recovery control. The controller 90 may apply the pressure higher than the pressure when the secondary battery 20 is used as the pressure for the recovery control.

The controller 90 calculates a necessary recovery period necessary for recovering the secondary battery 20 from the depth of charge/discharge of the secondary battery 20, the cell temperature of the secondary battery 20, and the magnitude of the pressure applied to the secondary battery 20. The necessary recovery period is a time period necessary for reducing the cell resistance of the secondary battery 20 by the amount of the recovery limit resistance value by the recovery control. The controller 90 executes the recovery control during at least the necessary recovery period. That is, when a time period in which the charging/discharging of the secondary battery 20 is stopped is a dwell time, the dwell time is a time period equal to or more than the necessary recovery period. In the recovery control, the charging/discharging of the secondary battery 20 is inhibited, and the surface pressure by the cell fastening member 26 is applied to the secondary battery 20. A deformation rate of the lithium metal increases as the pressure applied to the secondary battery 20 becomes high or the cell temperature of the secondary battery 20 becomes high. When the depth of charge of the secondary battery 20 is high or when the depth of discharge of the secondary battery 20 is low, the thickness of the secondary battery 20 increases, and the deformation amount of the lithium metal increases, and thus, the deformation rate of the lithium metal increases. Since the necessary recovery period is determined by the deformation rate of the lithium metal, the necessary recovery period has correlations with the depth of charge/discharge of the secondary battery 20, the cell temperature of the secondary battery 20, and the magnitude of the pressure applied to the secondary battery 20. The controller 90 preliminarily stores a map (hereinafter referred to as a "necessary recovery period map") showing the correlations between the magnitude of the pressure applied to the secondary battery 20, the cell temperature of the secondary battery 20, and the depth of charge/discharge of the secondary battery 20, and the recovery period in the memory 92, and refers to the necessary recovery period map to calculate the necessary recovery period. The controller 90 calculates the necessary recovery period during the charging/discharging of the secondary battery 20 or after the termination of the charging/discharging of the secondary battery 20.

When the recovery control of the secondary battery 20 is executed during the calculated necessary recovery period, the surface pressure by the cell fastening member 26 is applied to the lithium metal, and thus, the creep deformation is caused. The creep deformation moves the lithium metal to fill the void, and thus, the void is filled. When time passes with the lithium metal being pressurized, the creep amount gradually increases, and the lithium metal further fills the void.

Figure 4:
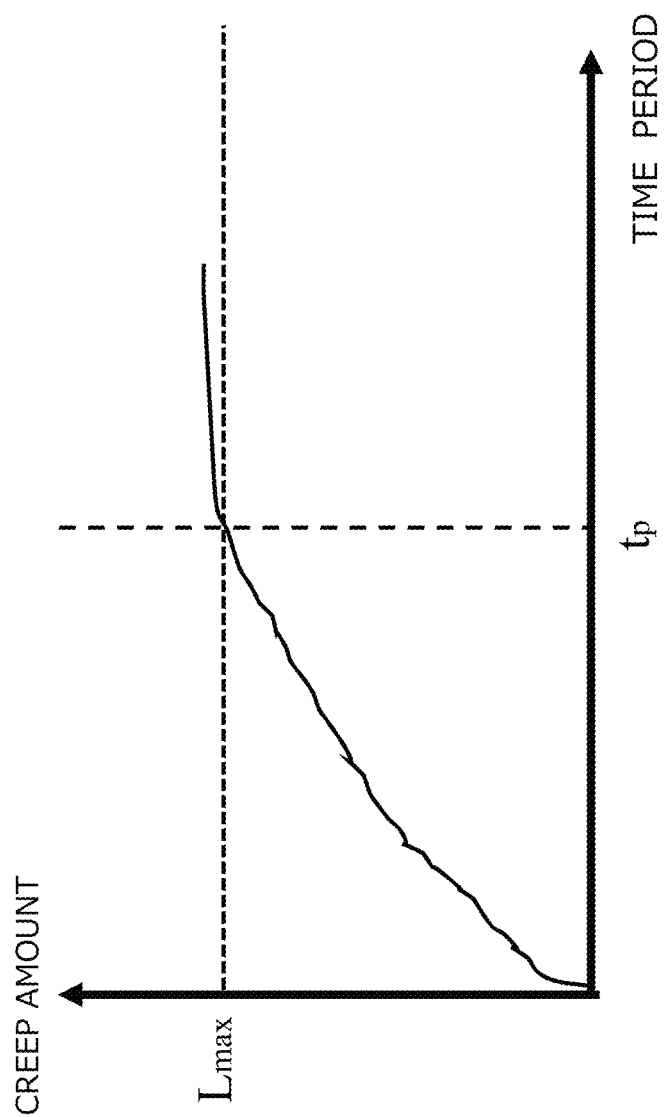
FIG. 4 is a graph illustrating characteristics of a creep amount of a lithium metal with respect to a time period of pressuring the lithium metal.

FIG. 4 is a graph illustrating characteristics of the creep amount of the lithium metal with respect to a time period of pressurizing the lithium metal. As illustrated in FIG. 4, with the passage of the time, the creep amount gradually increases. The increase of the creep amount squashes the void due to the pressure to the lithium metal, and thus, the volume of the void portion decreases. An upper limit value ($L_{max}$) of the creep amount is a creep amount necessary for recovering the resistance of the recovery limit resistance value. In FIG. 4, when the time period of pressurizing the lithium metal reaches time $t_p$, the creep amount reaches the upper limit value ($L_{max}$), and after time $t_p$, the creep amount slightly increases, but it is approximately constant. That is, from the start of pressurizing the lithium metal to time $t_p$, the recovery is expected, but after time $t_p$, the recovery is no longer expected. The recovery limit resistance value calculated by the controller 90 corresponds to the upper limit value ($L_{max}$) of the creep amount. Since the recovery control is executed when the Δ cell resistance is equal to or less than the recovery limit resistance value, in the range illustrated in FIG. 4, the recovery control is executed within a range where the recovery is expected. During the calculated necessary recovery period, the recovery control is executed, and when the creep amount of the lithium metal increases, the void is squashed to improve the contact in the interface between the lithium metal and the solid electrolyte. This reduces the cell resistance to achieve the recovery of the secondary battery 20. Additionally, since the recovery control is executed with the Δ cell resistance being equal to or less than the recovery limit resistance value, the recovery of the secondary battery 20 can be achieved while maintaining reversibility of the secondary battery 20.

Figure 5:
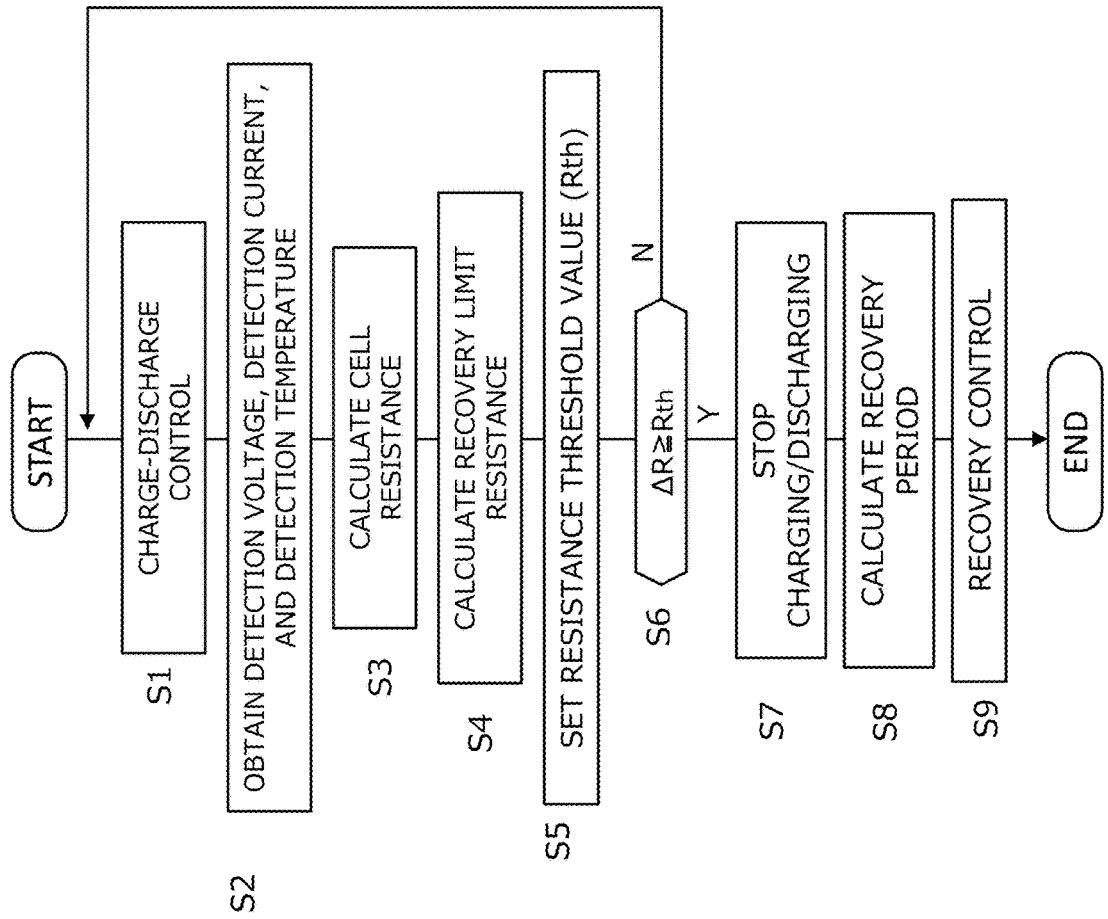
FIG. 5 is a flowchart of a recovery control process executed in the recovery control system for the secondary battery according to the embodiment.

Next, the recovery control method for the secondary battery 20 will be described. FIG. 5 is a flowchart illustrating a procedure of control processing in the recovery control system.

The controller 90 executes the control processing illustrated in FIG. 5 as soon as the charging or the discharging of the secondary battery 20 is started. At step S1, the controller 90 controls the voltage and current regulator 50 such that the current flowing in the secondary battery 20 matches a predetermined profile to control the charging or the discharging of the secondary battery 20. At step S2, the controller 90 obtains a detection voltage, a detection current, a detection temperature (a cell temperature) of the secondary battery 20 from the voltage sensor 30, the current sensor 60, and the temperature sensor 40. The controller 90 repeatedly executes the control processing of step S1 and step S2 to perform the charging or the discharging of the secondary battery 20. Note that, during the repeated execution of the control processing of step S1 and step S2, in the case where the charge-discharge control of the secondary battery 20 is terminated, for example, when the depth of charge of the secondary battery 20 has reached the target SOC, the controller 90 does not execute the recovery control by exiting the control loop from step S1 to step S6 in FIG. 5.

At step S3, the controller 90 calculates the cell resistance of the secondary battery 20 from a measured value of the impedance measuring device 80. The controller 90 calculates the Δ cell resistance by obtaining the difference between the initial value of the cell resistance and the current resistance value of the secondary battery 20.

At step S4, the controller 90 refers to the recovery limit resistance value map, and calculates the recovery limit resistance value of the secondary battery 20 from the depth of charge/discharge of the secondary battery 20, the cell temperature of the secondary battery 20, and the pressure applied to the secondary battery 20. The depth of charge/discharge of the secondary battery 20 is calculated from the detection voltage and/or the detection current of the secondary battery 20 obtained in the control processing of step S2. The cell temperature of the secondary battery 20 is the detection value of the temperature sensor 40 obtained in the control processing of step S2. At step S5, the controller 90 multiplies the recovery limit resistance value by a predetermined coefficient to set the resistance threshold value ($R_{th}$).

The coefficient is a value of one or less, and is set to, for example, between 0.8 and 0.9.

At step S6, the controller 90 compares the Δ cell resistance (ΔR) with the resistance threshold value ($R_{th}$), and determines whether the Δ cell resistance (ΔR) is equal to or more than the resistance threshold value ($R_{th}$) or not. When the Δ cell resistance (ΔR) is less than the resistance threshold value ($R_{th}$), the controller 90 returns the control flow to step S1, and executes the charge-discharge control. When the Δ cell resistance (ΔR) is equal to or more than the resistance threshold value ($R_{th}$), the controller 90 determines that the recovery control is necessary as the cell resistance of the secondary battery 20 has increased due to the void generated in the negative electrode containing the lithium metal and the Δ cell resistance has increased to a value close to the recovery limit resistance value.

At step S7, the controller 90 stops the charge-discharge control. at step S8, the controller 90 refers to the necessary recovery period map, and calculates the necessary recovery period for the recovery control from the depth of charge/discharge of the secondary battery 20, the cell temperature of the secondary battery 20, and the pressure applied to the secondary battery 20. At step S9, the controller 90 executes the recovery control. When an elapsed time from the point when the recovery control was started reaches the necessary recovery period, the controller 90 terminates the recovery control. That is, the recovery control is executed at the point when the resistance value (ΔR) of the Δ cell resistance reaches the resistance threshold value (Rah), and therefore, the controller 90 inhibits the charge-discharge control and executes the recovery control when the resistance value of the cell resistance is equal to or less than the recovery limit resistance value. After the recovery control is executed for the calculated necessary recovery period, the performance of the secondary battery 20 is recovered. After the secondary battery 20 is recovered, the controller 90 charges and discharges the secondary battery 20 corresponding to, for example, a request from the outside.

In this embodiment, the controller 90 may execute the recovery control after setting a charge parameter for charging the secondary battery 20 and/or an execution parameter for executing the recovery control so as to shorten the necessary recovery period. Since the necessary recovery period has the correlations with the depth of charge/discharge of the secondary battery 20, the cell temperature of the secondary battery 20, and the magnitude of the pressure applied to the secondary battery 20, adjusting these parameters ensure changing the necessary recovery period. For example, when the recovery control is executed, in the case where the cell temperature of the secondary battery 20 is low or in the case where the pressure applied to the secondary battery 20 by the cell fastening member 26 is low, the deformation rate of the lithium metal slows down. Therefore, when the calculated necessary recovery period is longer than a predetermined threshold value, the controller 90 adjusts the execution parameter for executing the recovery control. The execution parameter is indicated by at least one parameter of the cell temperature of the secondary battery 20 and the pressure applied to the secondary battery 20. The charge parameter is a charging period or the depth of charge of the secondary battery 20.

FIGS. 6(a) to 6(c) are graphs illustrating relations between the execution parameters of the recovery control or the charge parameter of the charge control and the necessary recovery period. FIG. 6(a) is a graph illustrating a correlation between the cell temperature of the secondary battery 20 and the necessary recovery period, FIG. 6(b) is a graph illustrating a correlation between the pressure applied to the secondary battery 20 and the necessary recovery period, and FIG. 6(c) is a graph illustrating a correlation between the depth of charge of the secondary battery 20 (or the thickness of the secondary battery 20) and the necessary recovery period.

As illustrated in FIGS. 6(a) to 6(c), the higher the temperature of the secondary battery 20 is, the higher the pressure applied to the secondary battery 20 is, and the higher the depth of charge of the secondary battery 20 is, the shorter the necessary recovery period becomes. In the example in FIG. 6(a), assume that the necessary recovery period calculated by the controller 90 is $t_{r\_H}$ when the cell temperature is $T_L$. In this case, since the calculated necessary recovery period ($t_{r\_H}$) is longer than a predetermined threshold value, the controller 90 controls the heater 70 to increase the cell temperature of the secondary battery 20 to $T_H$. The predetermined threshold value is a time period threshold value set in advance. When the cell temperature increases from $T_L$ to $T_H$, the necessary recovery period shortens from $t_{r\_H}$ to $t_{r\_L}$. Thus, in this embodiment, the controller 90 executes the recovery control while having temperature control that increases the cell temperature of the secondary battery 20 to higher than the current temperature included in the recovery control.

When the calculated necessary recovery period is longer than the predetermined threshold value, the controller 90 controls the cell fastening member 26 so as to increase the pressure applied to the secondary battery 20 to higher than the current pressure, and executes the recovery control. As illustrated in FIG. 6(b), when the recovery control is executed, increasing the pressure applied to the secondary battery 20 ensures shortening the necessary recovery period. Thus, in this embodiment, the controller 90 executes the recovery control while having pressurizing control that increases the pressure applied to the secondary battery 20 to higher than the current pressure included in the recovery control. Note that since the secondary battery 20 is used with the cell fastening member 26 applying the pressure, for example, it is only necessary to increase the pressure during the recovery control to higher than the pressure applied to the secondary battery 20 during the charge-discharge control of the secondary battery 20.

When the calculated necessary recovery period is longer than the predetermined threshold value, the controller 90 increases the depth of charge of the secondary battery 20 to higher than the current depth of charge. As illustrated in FIG. 6(c), increasing the depth of charge of the secondary battery 20 ensures shortening the necessary recovery period. The controller 90 calculates the necessary recovery period, and when the calculated necessary recovery period is longer than the predetermined threshold value, the controller 90 executes the charge control of the secondary battery 20 before executing the recovery control to increase the depth of charge of the secondary battery 20. After increasing the depth of charge of the secondary battery, the controller 90 stops the charge control and executes the recovery control.

Figure 7:
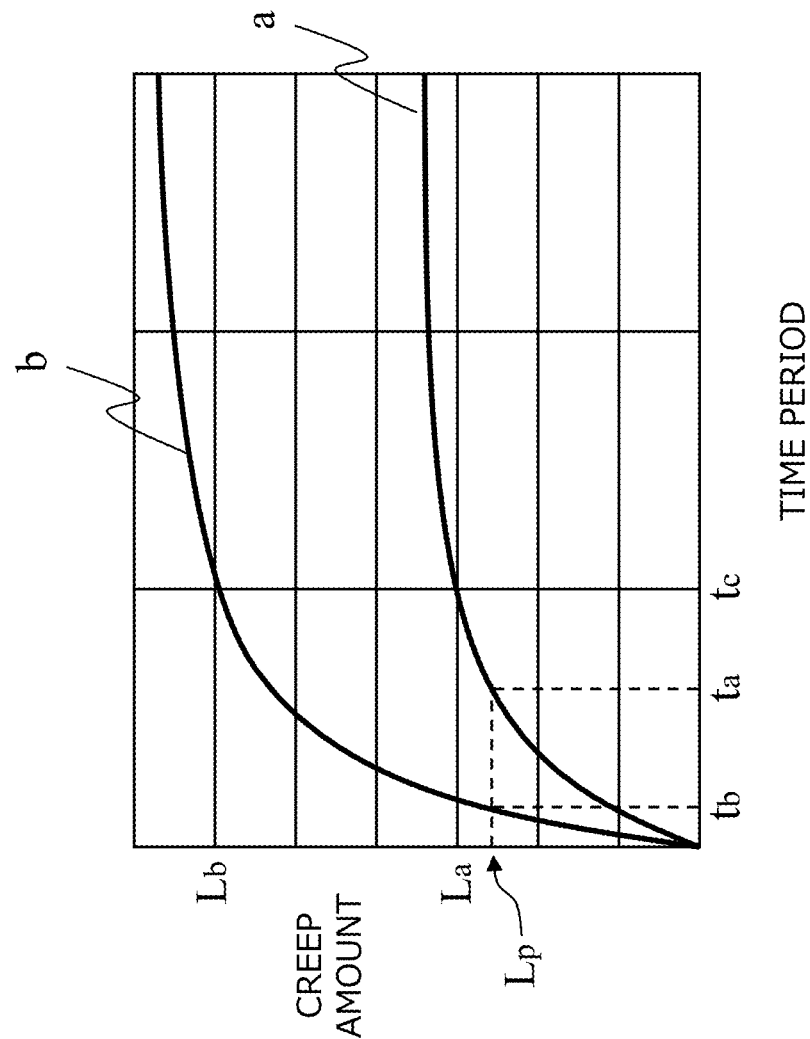
FIG. 7 is a graph illustrating correlations among a thicknesses of a lithium metal, an execution period of the recovery control, and the creep amount of the lithium metal in the secondary battery according to the embodiment.

FIG. 7 is a graph illustrating correlations among the thickness of the lithium metal, an execution period of the recovery control, and the creep amount of the lithium metal. In FIG. 7, the horizontal axis indicates a time period, and the vertical axis indicates a creep amount. The graph a illustrates characteristics of the case where the thickness of the negative electrode containing the lithium metal is thin (for example, 100 μm), and the graph b illustrates characteristics of the case where the thickness of the negative electrode containing the lithium metal is thick (for example, 200 μm).

When the lithium metal is used in the negative electrode, increasing the film thickness of the negative electrode ensures increasing the creep amount. When the depth of charge is low, the thickness of the negative electrode is thin, and therefore, a recovery effect from the creep deformation of the lithium metal is small. In order to increase the thickness of the negative electrode, it is effective to increase the depth of charge. In the example in FIG. 7, as illustrated in the graph a, in order to obtain a creep amount ($L_p$) of the lithium metal when the thickness of the negative electrode is thin, an execution period ($t_a$) of the recovery control is necessary. On the other hand, in order to obtain the creep amount ($L_p$) of the lithium metal as illustrated in the graph b when the thickness of the negative electrode is increased by increasing the depth of charge, an execution period ($t_b$) of the recovery control is necessary, and the execution period ($t_b$) of the recovery control is shorter than the execution period ($t_a$) of the recovery control when the thickness is thin. In the example in FIG. 7, when the recovery control is performed for an execution period ($t_c$) of the recovery control with the same conditions in the cell temperature of the secondary battery 20 and the pressure applied to the secondary battery 20, a creep amount ($L_b$) when the thickness of the negative electrode is thick is approximately doubled in comparison to a creep amount ($L_a$) when the thickness of the negative electrode is thin. That is, when the thickness of the negative electrode containing the lithium metal is doubled, the creep amount is also doubled.

Thus, in this embodiment, the controller 90 performs the charge control of the secondary battery 20 before executing the recovery control when shortening of the necessary recovery period is desired or when increasing of the creep amount of the lithium metal to increase the recovery limit resistance value is desired, thereby making the depth of charge when the recovery control is started equal to or more than a predetermined depth of charge. The predetermined depth of charge is a threshold value of a depth of charge set in advance or a depth of charge immediately before executing the charge control for shortening the necessary recovery period or increasing the creep amount. This ensures increasing the deformation rate of the lithium metal to squash the void at an early point, thus shortening the necessary recovery period. Alternatively, this ensures increasing the creep amount of the lithium metal, thus increasing the resistance value that ensures the recovery. Note that when the control of charging until the depth of charge of the secondary battery 20 reaches the target SOC is performed before executing the recovery control, the necessary recovery period or the creep amount of the lithium metal may be increased by increasing the target SOC.

Figure 8:
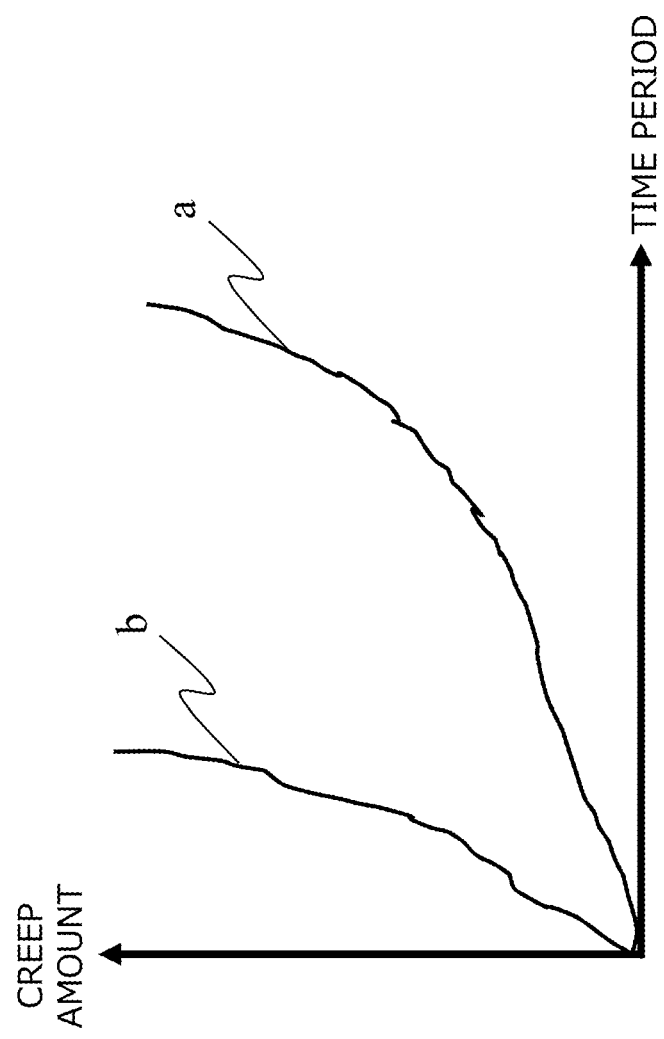
FIG. 8 is a graph illustrating correlations among a pressure applied to the secondary battery, the execution period of the recovery control, and the creep amount in the secondary battery according to the embodiment.

Also in this embodiment, when the pressure applied to the secondary battery 20 is controlled in the recovery control, the controller 90 at least controls the cell fastening member 26 so as to apply a pressure equal to or more than the pressure that causes the creep deformation to the secondary battery 20. FIG. 8 is a graph illustrating correlations among the pressure applied to the secondary battery 20, the execution period of the recovery control, and the creep amount. In FIG. 8, the horizontal axis indicates a time period, and the vertical axis indicates a creep amount. The graph a illustrates characteristics when the pressure is low, and the graph b illustrates characteristics when the pressure is high. Note that when the pressure applied to the secondary battery 20 is less than the pressure that causes the creep deformation of the negative electrode, the creep deformation is not caused, and therefore, the creep amount is zero or a value close to zero. When the pressure equal to or more than the pressure that causes the creep deformation is applied to the secondary battery 20, the creep amount increases with the lapse of the execution period of the recovery control. When the creep amount when the pressure is high is compared with the creep amount when the pressure is low with the same execution period of the recovery control, the creep amount when the pressure is high is larger than the creep amount when the pressure is low. That is, when the pressure is high, the recovery necessary period can also be shortened by the increased creep amount per unit time. Thus, in this embodiment, the controller 90 applies the pressure equal to or more than the pressure that causes the creep deformation of the negative electrode containing the lithium metal to the secondary battery 20 when executing the recovery control. The controller 90 also increases the pressure applied to the secondary battery 20 in order to shorten the necessary recovery period. This ensures increasing the deformation rate of the lithium metal by increasing the pressure to squash the void at an early point, thus shortening the necessary recovery period.

Also in this embodiment, when the cell temperature of the secondary battery 20 is increased in order to shorten the necessary recovery period in the recovery control, the recovery control is executed in a range equal to or less than a melting point (180° C.) of the lithium metal (in the case of the lithium alloy, the lithium metal contained in the lithium alloy) contained in the negative electrode. The following table shows hardness of lithium metal foil with respect to cell temperatures.

TABLE 1

| Sample | Cell Temperature | Estimated Hardness (GPa) |
|---|---|---|
| Li Metal Foil | Room Temperature | 0.0049 |
|  | 60° C. | 0.0025 |
|  | 100° C. | 0.0016 |

As illustrated in Table 1, the higher the cell temperature is, the more flexible the lithium metal becomes. The controller 90 controls the cell fastening member 26 so as to increase the cell temperature of the secondary battery 20 in the range equal to or less than the melting point (180° C.) of the lithium metal when the cell temperature of the secondary battery 20 is increased in order to shorten the necessary recovery period. This ensures making the lithium metal flexible and increasing the deformation rate of the lithium metal to squash the void at an early point, thus shortening the necessary recovery period.

Figure 9:
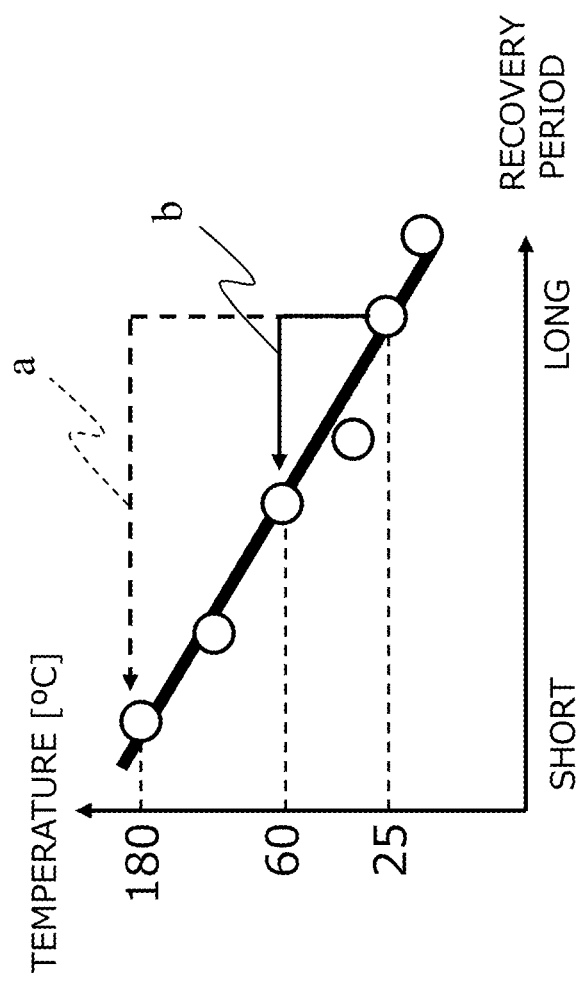
FIG. 9 is a graph illustrating a correlation between a cell temperature and the recovery period in the secondary battery according to the embodiment.

Also in this embodiment, when the calculated necessary recovery period is longer than the predetermined threshold value, the controller 90 combines at least two parameters of the cell temperature of the secondary battery 20, the pressure applied to the secondary battery 20, and the depth of charge of the secondary battery 20, and increases the respective parameters, and thus, the necessary recovery period may be shortened. FIG. 9 is a graph illustrating a correlation between the cell temperature of the secondary battery 20 and the necessary recovery period. For example, assume that the depth of charge of the secondary battery 20 is 10%, the cell temperature of the secondary battery 20 is 25° C., and the calculated necessary recovery period is longer than the predetermined threshold value. Furthermore, assume that when it is attempted to shorten the necessary recovery period to equal to or less than the predetermined threshold value only by control of the cell temperature of the secondary battery 20, the cell temperature of the secondary battery 20 has to be increased to 180° C. Since the melting point of the lithium metal contained in the negative electrode is 180° C., increasing the cell temperature to 180° C. is not realistic (corresponds to the arrow a in FIG. 9). Therefore, in order to shorten the necessary recovery period, the controller 90 sets the cell temperature to 60° C. (corresponds to the arrow b in FIG. 9) and sets the depth of charge of the secondary battery 20 to triple the current depth. This ensures shortening the necessary recovery period while keeping the secondary battery 20 at a temperature lower than the melting point of the lithium metal. Note that while the description has been made using the example of increasing each of the cell temperature and the depth of charge, the necessary recovery period may be shortened, for example, by increasing each of the depth of charge and the pressure applied to the secondary battery 20.

Also in this embodiment, the controller 90 combines at least two parameters of the cell temperature of the secondary battery 20, the pressure applied to the secondary battery 20, and the depth of charge of the secondary battery 20, and increases the respective parameters, and thus, the recovery limit resistance value may be increased. The recovery limit resistance value has the correlations with the magnitude of the pressure applied to the secondary battery 20, the cell temperature of the secondary battery 20, and the depth of charge/discharge of the secondary battery 20, and the higher the pressure is, the higher the cell temperature is, or the higher the depth of charge is, the higher the recovery limit resistance value becomes. Therefore, the recovery limit resistance value may be increased by increasing the plurality of parameters. When the recovery limit resistance value increases, the creep amount of the lithium metal increases, thereby increasing the resistance value that ensures the recovery by the recovery control.

Figure 10:
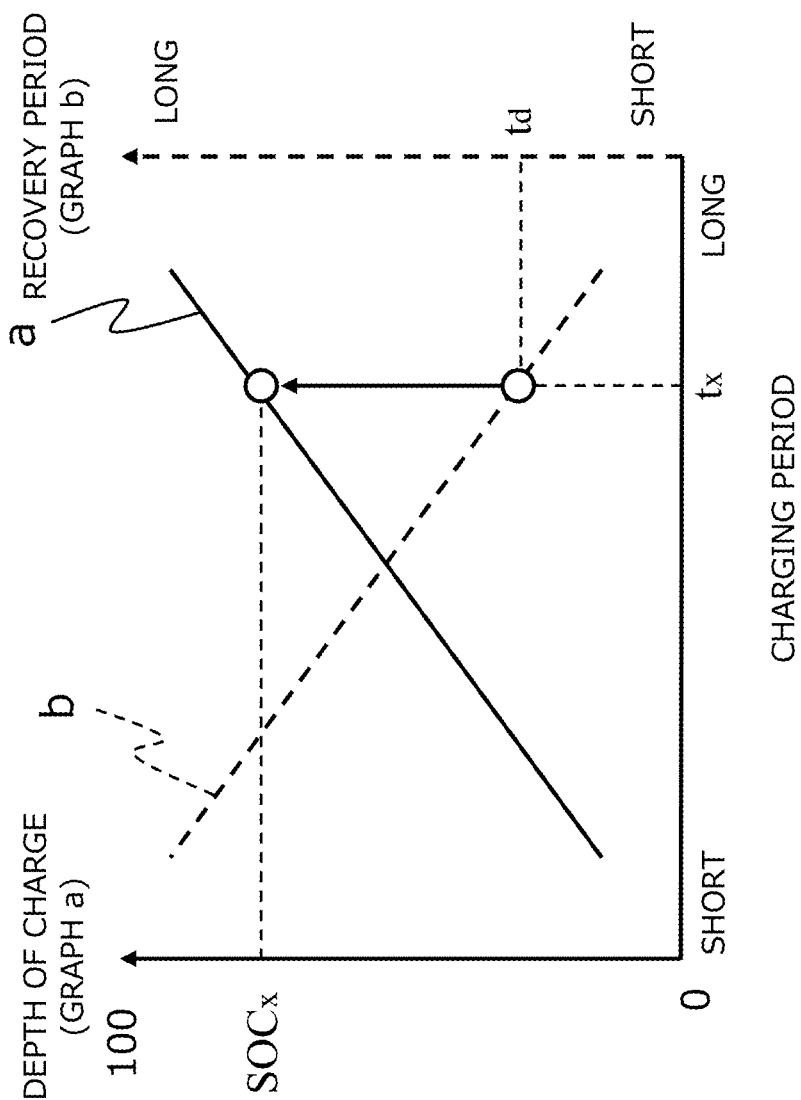
FIG. 10 is a graph illustrating correlations among a charging period, a depth of charge, and the recovery period in the secondary battery according to the embodiment.

Also in this embodiment, the controller 90 may calculate a charging period of the secondary battery 20 corresponding to a length of the calculated necessary recovery period, and charge the secondary battery 20 for the calculated charging period before the recovery control. FIG. 10 is a graph illustrating correlations among the charging period of the secondary battery 20, the depth of charge of the secondary battery 20, and the necessary recovery period. The horizontal axis indicates a charging period, the vertical axis in a solid line indicates a depth of charge, and the vertical axis in a dotted line indicates a necessary recovery period. When the depth of charge of the secondary battery 20 at the termination of the charging is increased, it is necessary to increase a charging capacity, and therefore, the charging period becomes longer as the depth of charge increases as illustrated in the graph a. Note that, corresponding to the depth of charge at the start of the charging, the graph a moves in parallel along the vertical axis in the coordinate system illustrated in FIG. 10. When the charging period is long, the depth of charge after the termination of the charging increases, and therefore, the necessary recovery period shortens. That is, as illustrated in the graph b, the longer the charging period is, the shorter the necessary recovery period becomes.

For example, when the length of the necessary recovery period calculated by the controller 90 is a time period ($t_d$), the charging period is a time period ($t_x$) corresponding to a necessary recovery period ($t_d$) on the graph b. When the secondary battery 20 is charged for the charging period ($t_x$), the depth of charge after the termination of the charging of the secondary battery 20, that is, the depth of charge at the start of the recovery control is $SOC_x$. That is, in order to execute the recovery control with the calculated necessary recovery period, the charging period of the secondary battery 20 is the time period ($t_x$), and the target SOC of the secondary battery 20 is $SOC_x$.

The controller 90 stores a map (hereinafter referred to as a "charging period/depth of charge map" illustrating correlations among the necessary recovery period, the charging period, and the target depth of charge. The controller 90 refers to the charging period/depth of charge map after calculating the recovery period, and calculates the charging period and the depth of charge corresponding to the necessary recovery period in the charging period/depth of charge map. The controller 90 notifies a user of the calculated charging period using a display device or the like. This ensures presenting the charging period necessary for the recovery control to the user.

Note that when calculating the necessary recovery period during the charging of the secondary battery 20, the controller 90 may calculate each of the charging period and the depth of charge corresponding to the necessary recovery period by a calculation method using the above-described charging period/depth of charge map during the charging of the secondary battery 20, and update the profiles of the charge control so as to set the charging period of the secondary battery 20 to the calculated charging period and the depth of charge after the charging to the calculated depth of charge.

As described above, in this embodiment, the cell resistance of the secondary battery 20 is calculated, the recovery limit resistance value indicating the upper limit value of the resistance that ensure recovering the secondary battery 20 is calculated from the depth of charge/discharge of the secondary battery 20, the cell temperature of the secondary battery 20, and the pressure applied to the secondary battery 20, and when the resistance value of the cell resistance is equal to or less than the recovery limit resistance value, the charging/discharging of the secondary battery is inhibited and the recovery control to recover the secondary battery is executed. In view of this, the creep deformation of the lithium metal fills the void made in the interface between the lithium and the solid electrolyte to ensure reducing the resistance. As a result, the performance of the secondary battery 20 can be recovered.

Also in this embodiment, the necessary recovery period necessary for recovering the secondary battery 20 is calculated from at least one parameter of the depth of charge/discharge, the cell temperature, and the pressure, and when the necessary recovery period is longer than the predetermined period, the charge parameter for charging the secondary battery 20 and/or the execution parameter for executing the recovery control are set so as to shorten the necessary recovery period. The charge parameter is the charging period and/or the depth of charge. The execution parameter of the recovery control is the pressure to the secondary battery 20 controlled by the cell fastening member 26 and/or the cell temperature of the secondary battery 20 controlled by the heater 70. This ensures shortening the necessary recovery period to accelerate the recovery of the secondary battery 20.

Also in this embodiment, the recovery control includes the pressurizing control that applies the pressure equal to or more than the pressure that causes the creep deformation of the negative electrode to the secondary battery 20. In view of this, the creep deformation of the lithium metal fills the void made in the interface between the lithium and the solid electrolyte to ensure reducing the resistance.

Also in this embodiment, the recovery control includes the temperature control that increases the cell temperature to higher than the current temperature of the secondary battery. In view of this, the deformation rate of the lithium metal is increased to shorten the necessary recovery period, thereby ensuring accelerating the recovery of the secondary battery 20.

Also in this embodiment, the depth of charge of the secondary battery 20 when the recovery control is started is set to equal to or more than the predetermined depth of charge. In view of this, the thickness of the lithium metal increases to increase the deformation rate of the lithium metal, and therefore, the void can be filled at an early point to shorten the necessary recovery period.

Also in this embodiment, the necessary recovery period necessary for the recovery of the secondary battery 20 is calculated from at least one parameter of the depth of charge/discharge, the cell temperature, and the pressure, the charging period of the secondary battery 20 is calculated corresponding to the length of the calculated necessary recovery period, and the secondary battery 20 is charged for the calculated charging period before the recovery control. In view of this, the charging period necessary for obtaining the recovery effect can be calculated.

Also in this embodiment, after recovering the secondary battery 20 by the recovery control, the secondary battery 20 is charged and discharged. In view of this, after reducing the increased cell resistance of the secondary battery 20 by the recovery control, the normal charge-discharge control can be executed. As a result, a performance life of the secondary battery 20 can be extended.

Also in this embodiment, when the resistance value of the cell resistance is higher than the recovery limit resistance value, the plurality of parameters of the depth of charge, the cell temperature, and the pressure are increased so as to increase the recovery limit resistance value. In view of this, when the recovery control is performed, an optimal parameter can be selected so as not to put a load on the secondary battery 20. As a result, the performance of the secondary battery 20 can be recovered while preventing the secondary battery 20 from deteriorating.

The recovery control system for the secondary battery according to the embodiment may be disposed in a vehicle control system. The following describes a vehicle control system including the recovery control system for the secondary battery according to the embodiment. The vehicle control system is a system using the secondary battery 20 as a power source. The vehicle control system is used as a system for driving a vehicle, such as an electric vehicle only using a motor as a driving source and a hybrid vehicle with a motor and an engine. The controller 90 calculates the Δ cell resistance (ΔR) of the secondary battery 20 and the recovery limit resistance value during the charging/discharging of the secondary battery 20, such as during travelling of the vehicle. The controller 90 compares the Δ cell resistance (ΔR) of the secondary battery 20 with the resistance threshold value ($R_{th}$). When the Δ cell resistance (ΔR) is equal to or more than the resistance threshold value ($R_{th}$), it is determined that the Δ cell resistance of the secondary battery 20 has increased to a value close to the recovery limit resistance value, and the recovery control is necessary. In order to inhibit the charging/discharging of the secondary battery 20, the controller 90 displays the fact that the recovery control is necessary in a current state of the secondary battery 20 or a state where the secondary battery 20 is not charged/discharged on, for example, a vehicle display to give a driver a notification for recommending stopping the vehicle. The controller 90 then executes the recovery control in the state where the secondary battery 20 is not charged/discharged while the vehicle stops. Since the recovery control is executed in the state where the Δ cell resistance (ΔR) of the secondary battery 20 is equal to or less than the recovery limit resistance value, the recovery of the secondary battery 20 can be achieved while maintaining the reversibility of the secondary battery 20.

For example, when the secondary battery 20 can be charged using a power source from the outside of the vehicle, such as a plug-in hybrid vehicle, the recovery control can be executed also during travelling of the vehicle. For example, when it is determined that the recovery control is necessary during travelling of the vehicle, the controller 90 switches a travel mode of the vehicle to a travel mode for travelling only with the engine. The switching of the travel modes ensures limiting the use of the secondary battery 20 while maintaining the travelling of the vehicle. The controller 90 inhibits the charging/discharging of the secondary battery 20 and executes the recovery control during the travel mode for travelling only with the engine. This ensure achieving the recovery of the secondary battery 20.

While the embodiments of the present invention have been described above, these embodiments are described for easily understanding the present invention, and are not described for limiting the present invention. Accordingly, each component disclosed in the above-described embodiments is intended to include all design changes and equivalents falling within the technical scope of the present invention.

Example

While the following describes the present invention in further detail based on an example, the present invention is not limited to the example.

Manufacturing Prototype (Example)

A mixture made by mixing a raw material composition containing $Li_2S$ and $P_2S_5$ in an agate mortar was pulverized with a ball mill at 380 rpm for 40 hours to manufacture powder containing $Li_2S$ and $P_2S_5$ with a weight ratio (75:25). After the powder was further pulverized in the agate mortar, 100 mg of the powder was weighed, put into a mold with a depth of 700 μm, temporarily molded by cold-pressing at 360 MPa, compression-molded by hot-pressing at 360 MPa at 190° C. for one hour, and punched out, and thus a pellet (an LPS pellet) as a solid electrolyte was manufactured. The solid electrolyte had a diameter of 10 mm, and a lithium layer had a diameter of 5 mm. A cell was made by putting a lithium metal on the pellet. A plate-shaped metal tab was bonded on the cell manufactured through these processes, and thus, a lithium symmetric cell as a prototype was manufactured.

<Charge Conditions>

The prototype of the example obtained as described above was charged with a charging current density of 0.5 $mA/cm^2$ and a charging capacity of 0.1 $mAh/cm^2$ while being fastened by a fastening member (a spring) to be pressurized at 1.0 MPa. After the charging, resistance was measured from a measurement result of electrochemical impedance spectroscopy (EIS) measurement of the prototype, and the charge-discharge cycle was repeatedly performed until a resistance increase (overvoltage) caused by void generation could be confirmed.

<Recovery Conditions>

The prototype after the confirmation of the resistance increase caused by the void generation was rested for six hours with a pressure of 1.0 MPa being applied.

<Electrochemical Measurement>

While the prototype was charged under the above-described charge conditions, charge/discharge measurement and the EIS measurement were performed. FIG. 11 is a graph illustrating the measurement results, and illustrates voltage characteristics (the graph a) when the resistance increase caused by the void generation was confirmed during the charging of the prototype and voltage characteristics (the graph b) when the prototype after the recovery under the above-described recovery conditions was charged under the above-described charge conditions.

Evaluation of Example

It could be confirmed that the void generation increased the resistance of the prototype by approximately 15 times (730Ω) with respect to initial resistance (50Ω), but the rest under the above-described recovery conditions reduced the resistance of the prototype by approximately 1.2 times (60Ω) with respect to the initial resistance (50Ω). As illustrated in FIG. 11, it can be confirmed that the prototype (the graph a) before the rest had an overvoltage increased due to the void generation during the charging. On the other hand, it can be confirmed that the prototype (the graph b) after the rest had the voltage transitioning constantly at approximately the same value as the voltage value before the overvoltage increased due to the void generation. That is, in the example, it could be confirmed that the battery performance was recovered by resting under the above-described recovery conditions.

DESCRIPTION OF REFERENCE SIGNS

10 . . . recovery control system
20 . . . secondary battery
21 . . . positive electrode
22 . . . negative electrode
23 . . . solid electrolyte
24a, 24b . . . electrode tab
25 . . . exterior member
26 . . . cell fastening member
30 . . . voltage sensor
40 . . . temperature sensor
50 . . . voltage and current regulator
60 . . . current sensor
70 . . . heater
80 . . . impedance measuring device
90 . . . controller
91 . . . CPU
92 . . . memory
100 . . . external power supply

The invention claimed is:

1. A recovery control method for a secondary battery, the secondary battery including a positive electrode containing a positive electrode active material, a solid electrolyte, and a negative electrode containing a negative electrode active material containing at least a lithium metal or a lithium alloy, the secondary battery being fastened from an outside, the recovery control method comprising:
   measuring cell resistance of the secondary battery;
   calculating a recovery limit resistance value indicating an upper limit value of resistance that ensures recovering the secondary battery from a depth of charge/discharge of the secondary battery, a cell temperature of the secondary battery, and a pressure applied to the secondary battery; and inhibiting charging/discharging the secondary battery and executing recovery control that recovers the secondary battery when a resistance value of the cell resistance is equal to or less than the recovery limit resistance value.

2. The recovery control method according to claim 1, comprising:
calculating a necessary recovery period necessary for recovering the secondary battery from at least one parameter of the depth of charge/discharge, the cell temperature, and the pressure applied to the secondary battery; and
setting a charge parameter for charging the secondary battery and/or an execution parameter for executing the recovery control so as to shorten the necessary recovery period when the necessary recovery period is longer than a predetermined period.

3. The recovery control method according to claim 1, wherein
the recovery control includes pressurizing control that applies a pressure equal to or more than a pressure that causes a creep deformation of the negative electrode to the secondary battery.

4. The recovery control method according to claim 1, wherein the recovery control includes temperature control that increases the cell temperature to higher than a current temperature of the secondary battery.

5. The recovery control method according to claim 1, wherein a depth of charge of the secondary battery when the recovery control is started is set to equal to or more than a predetermined depth of charge.

6. The recovery control method according to claim 1, comprising:
calculating a necessary recovery period necessary for recovering the secondary battery from at least one parameter of the depth of charge/discharge, the cell temperature, and the pressure applied to the secondary battery;
calculating a charging period of the secondary battery corresponding to a length of the calculated necessary recovery period; and
charging the secondary battery for the charging period before the recovery control.

7. The recovery control method according to claim 1, wherein the secondary battery is charged and discharged after the recovery control recovers the secondary battery.

8. The recovery control method according to claim 1, wherein
when the resistance value of the cell resistance is higher than the recovery limit resistance value, a plurality of parameters of the depth of charge of the secondary battery, the cell temperature, and the pressure applied to the secondary battery are increased so as to increase the recovery limit resistance value.

9. A recovery control system comprising:
a secondary battery including a positive electrode containing a positive electrode active material, a solid electrolyte, and a negative electrode containing a negative electrode active material containing a lithium metal or a lithium alloy, the secondary battery being fastened from an outside;
a measuring device that measures cell resistance of the secondary battery; and
a controller that executes recovery control that recovers the secondary battery, wherein the controller:
calculates a recovery limit resistance value indicating an upper limit value of resistance that ensures recovering the secondary battery from a depth of charge/discharge of the secondary battery, a cell temperature of the secondary battery, and a pressure applied to the secondary battery; and
inhibits charging/discharging the secondary battery and executes the recovery control when a resistance value of the cell resistance is equal to or less than the recovery limit resistance value.

10. A vehicle control system comprising
the recovery control system according to claim 9, wherein
the vehicle control system controls a vehicle using the secondary battery as a power source, and
the controller executes the recovery control while the vehicle stops.

11. The vehicle control system according to claim 10, wherein the controller:
compares the resistance value of the cell resistance with a resistance threshold value set corresponding to the recovery limit resistance value; and
gives a driver of the vehicle a notification for recommending stopping the vehicle when the resistance value of the cell resistance is higher than the resistance threshold value.

12. A vehicle control system comprising
the recovery control system according to claim 9, wherein
the vehicle control system controls a hybrid vehicle with an engine and a motor coupled to the secondary battery, and
the controller inhibits charging/discharging the secondary battery and executes the recovery control during a travel mode for travelling only with the engine.

* * * * *